(12) United States Patent
Park et al.

(10) Patent No.: US 10,134,477 B2
(45) Date of Patent: Nov. 20, 2018

(54) NONVOLATILE MEMORY DEVICE DETECTING POWER NOISE AND OPERATING METHOD THEREOF

(71) Applicant: Samsung Electronics Co., Ltd., Suwon-si, Gyeonggi-do (KR)

(72) Inventors: Sang-Soo Park, Hwaseong-si (KR); Jaeyong Jeong, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 15/625,189

(22) Filed: Jun. 16, 2017

(65) Prior Publication Data

US 2018/0122485 A1 May 3, 2018

(30) Foreign Application Priority Data

Oct. 28, 2016 (KR) .................. 10-2016-0142038

(51) Int. Cl.
| | |
|---|---|
| *G11C 16/10* | (2006.01) |
| *G11C 16/30* | (2006.01) |
| *G11C 16/14* | (2006.01) |
| *G11C 16/24* | (2006.01) |
| *G11C 16/26* | (2006.01) |
| *G11C 11/56* | (2006.01) |

(52) U.S. Cl.
CPC ............. *G11C 16/30* (2013.01); *G11C 16/14* (2013.01); *G11C 16/24* (2013.01); *G11C 16/26* (2013.01); *G11C 11/5635* (2013.01); *G11C 11/5642* (2013.01)

(58) Field of Classification Search
CPC ................................ G11C 16/10; G11C 16/26

USPC ......................................... 365/185.11, 185.24
See application file for complete search history.

(56) References Cited

U.S. PATENT DOCUMENTS

| | | | | | |
|---|---|---|---|---|---|
| 4,922,133 | A | * | 5/1990 | Iwahashi | .................. H03K 5/08 327/74 |
| 4,974,206 | A | * | 11/1990 | Iyama | ..................... G11C 16/28 365/185.18 |
| 5,508,958 | A | * | 4/1996 | Fazio | .................. G11C 11/5621 365/168 |
| 6,288,963 | B1 | | 9/2001 | Kato | |

(Continued)

FOREIGN PATENT DOCUMENTS

| | | |
|---|---|---|
| JP | H19980260911 A | 9/1998 |
| KR | 100378603 B1 | 3/2003 |

*Primary Examiner* — Michael Tran
(74) *Attorney, Agent, or Firm* — Harness, Dickey & Pierce, P.L.C.

(57) ABSTRACT

A nonvolatile memory device includes a memory cell array that stores data, and control logic. The control logic is configured to control a read operation, a program operation, or an erase operation on the data. The control logic is configured to detect a first power noise based on one of voltage sources to be provided to the memory cell array and a first reference voltage and detect a second power noise based on the one voltage source of the voltage sources and each of the first reference voltage and a second reference voltage. The control logic is configured to determine whether to perform at least one of an operation period of the read operation, an operation period of the program operation, or an operation period of the erase operation, based on whether at least one of the first and second power noises is detected.

17 Claims, 16 Drawing Sheets

(56) References Cited

U.S. PATENT DOCUMENTS

| | | | |
|---|---|---|---|
| 6,404,976 B1* | 6/2002 | Kondoh | G11B 27/324 360/61 |
| 6,823,293 B2 | 11/2004 | Chen et al. | |
| 7,339,411 B2 | 3/2008 | Yuuki et al. | |
| 7,379,347 B1* | 5/2008 | Nautiyal | G11C 11/413 365/154 |
| 7,495,974 B2* | 2/2009 | Kim | G11C 5/143 365/189.07 |
| 7,495,982 B2* | 2/2009 | Chi | G05F 1/465 365/203 |
| 7,567,469 B2 | 7/2009 | Lee | |
| 7,599,241 B2 | 10/2009 | Sprouse et al. | |
| 7,679,133 B2 | 3/2010 | Son et al. | |
| 7,724,076 B2* | 5/2010 | Byeon | G05F 1/465 327/540 |
| 7,835,198 B2* | 11/2010 | Choi | G11C 11/4074 365/149 |
| 7,882,375 B2 | 2/2011 | Yoon | |
| 8,042,013 B2 | 10/2011 | Eto | |
| 8,140,880 B2 | 3/2012 | Kimura | |
| 8,553,466 B2 | 10/2013 | Han et al. | |
| 8,559,235 B2 | 10/2013 | Yoon et al. | |
| 8,654,587 B2 | 2/2014 | Yoon et al. | |
| 9,218,851 B2 | 12/2015 | Shlick et al. | |
| 9,846,504 B2* | 12/2017 | Endo | G06F 3/0416 |
| 2002/0050616 A1* | 5/2002 | Kurosaki | G11C 16/28 257/357 |
| 2004/0027903 A1* | 2/2004 | Kato | G11C 7/02 365/222 |
| 2004/0128115 A1* | 7/2004 | Chen | G01R 31/3004 702/191 |
| 2005/0094472 A1* | 5/2005 | Ishikawa | G11C 5/14 365/226 |
| 2005/0219900 A1* | 10/2005 | Kamigaki | G11C 16/0425 365/185.14 |
| 2006/0221749 A1 | 10/2006 | Kwean | |
| 2006/0262628 A1* | 11/2006 | Nii | G11C 5/063 365/226 |
| 2007/0030741 A1* | 2/2007 | Nii | G11C 5/06 365/189.11 |
| 2007/0286006 A1* | 12/2007 | Wu | G11C 5/145 365/226 |
| 2008/0007246 A1* | 1/2008 | Veendrick | G01R 31/317 324/76.11 |
| 2008/0309163 A1* | 12/2008 | Hashimoto | H02J 7/0029 307/31 |
| 2008/0309533 A1* | 12/2008 | Baker | G11C 7/02 341/143 |
| 2011/0022789 A1* | 1/2011 | Fujimoto | G06K 19/07 711/103 |
| 2011/0233648 A1 | 9/2011 | Seol et al. | |
| 2011/0298474 A1* | 12/2011 | Cheruiyot | G01R 29/26 324/613 |
| 2013/0223164 A1* | 8/2013 | Ozoe | G11C 7/06 365/189.011 |
| 2013/0272060 A1* | 10/2013 | Andre | G11C 11/1673 365/158 |
| 2014/0003562 A1* | 1/2014 | Okabe | H04B 1/1081 375/347 |
| 2014/0085762 A1* | 3/2014 | Shimano | H02M 1/08 361/91.6 |
| 2015/0003151 A1* | 1/2015 | Lee | G11C 16/10 365/185.02 |
| 2015/0091829 A1* | 4/2015 | Endo | G09G 3/3696 345/173 |
| 2015/0247892 A1* | 9/2015 | Robertazzi | G01R 31/2607 324/414 |
| 2015/0348600 A1* | 12/2015 | Bhatia | G11C 5/147 365/189.16 |
| 2016/0043705 A1* | 2/2016 | Tang | H03K 3/012 327/63 |

* cited by examiner (Case 1)

(Case 2)

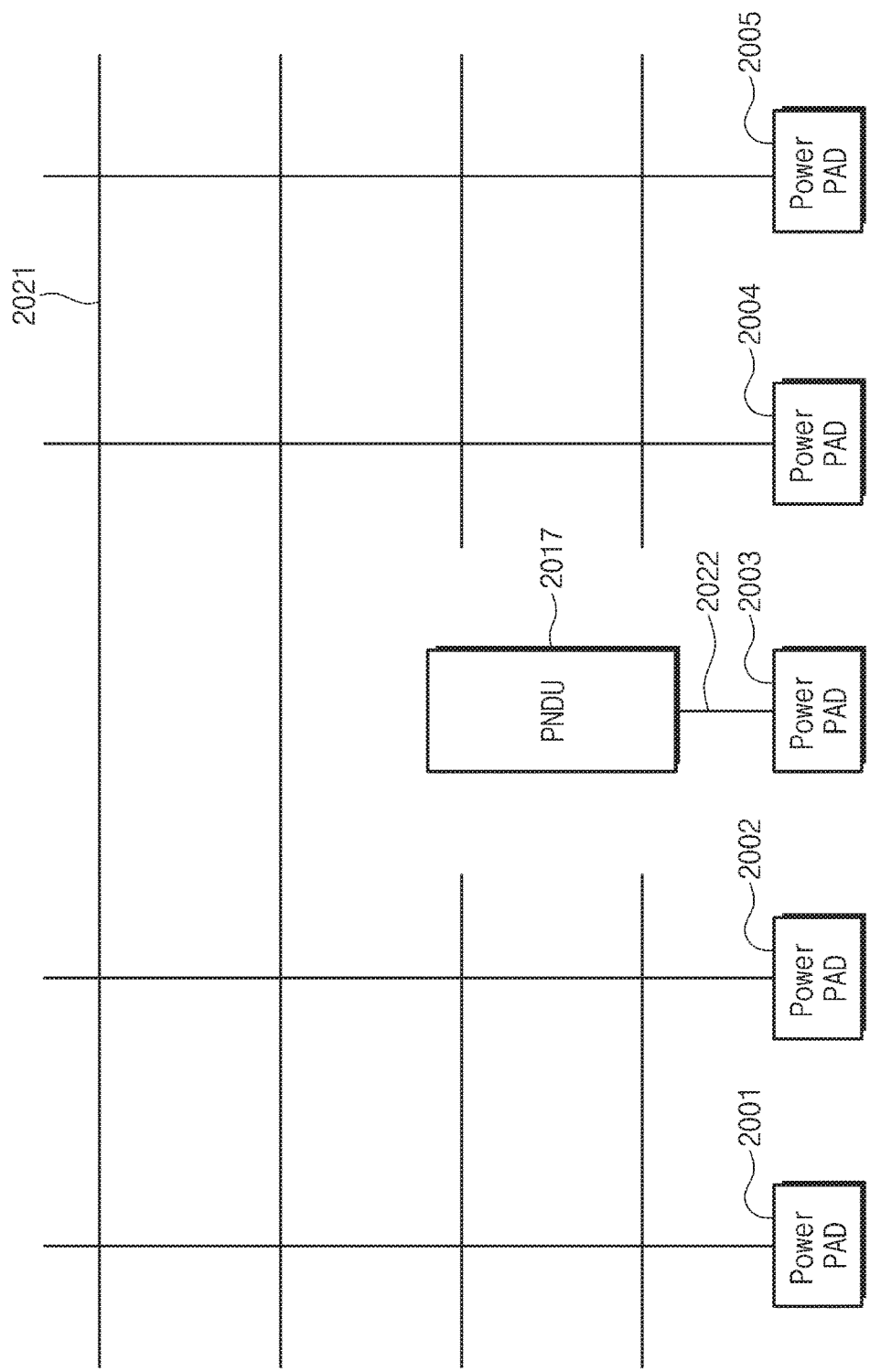

NONVOLATILE MEMORY DEVICE DETECTING POWER NOISE AND OPERATING METHOD THEREOF

CROSS-REFERENCE TO RELATED APPLICATIONS

A claim for priority under 35 U.S.C. § 119 is made to Korean Patent Application No. 10-2016-0142038 filed Oct. 28, 2016, in the Korean Intellectual Property Office, the entire contents of which are hereby incorporated by reference.

BACKGROUND

Example embodiments of the inventive concepts disclosed herein relate to a semiconductor memory device, and more particularly, to a nonvolatile memory device that detects power noise and an operating method thereof.

Semiconductor memory devices are classified into volatile semiconductor memory devices and nonvolatile semiconductor memory devices.

Volatile semiconductor memory devices are fast in read and write speeds, but lose data stored therein when power is not supplied thereto. In contrast, nonvolatile semiconductor memory devices retain data stored therein even when power is not supplied thereto. For this reason, nonvolatile semiconductor memory devices are used to store information that has to be retained regardless of whether power is supplied thereto. Nonvolatile semiconductor memory devices include mask read-only memory (MROM), programmable ROM (PROM), erasable programmable ROM (EPROM), electrically erasable programmable ROM (EEPROM), etc.

In nonvolatile semiconductor memory devices, errors may be generated due to various factors. Nonvolatile semiconductor memory devices may secure reliability by removing a memory block, in which an error is generated, from a mapping table. However, in most cases, an error due to power noise may be transient unlike an error due to physical defects.

SUMMARY

Some example embodiments of the inventive concepts provide a nonvolatile memory device that detects power noise and uses the detection result to manage memory blocks and an operating method thereof.

Some example embodiments of the inventive concepts provide a nonvolatile memory device including a memory cell array that stores data, and control logic that controls a read operation, a program operation, or an erase operation on the data. The control logic detects a first power noise by comparing one of voltage sources to be provided to the memory cell array with a first reference voltage and detects a second power noise by comparing the one of the voltage sources with each of the first reference voltage and a second reference voltage. The control logic determines whether to perform some of operation periods of the read operation, the program operation, or the erase operation, based on whether at least one of the first and second power noises are detected.

Some example embodiments of the inventive concepts provide a memory system including a nonvolatile memory device that includes a memory cell array and a control logic. The memory cell array is configured to store data. The control logic is configured to control a read operation, a program operation, or an erase operation on the data, detect first and second power noises based on one of voltage sources provided to the memory cell array and first and second reference voltages, and determine whether to perform at least one of an operation period of the read operation, on operation period of the program operation, or an operation period of the erase operation, based on whether at least one of the first and second power noises are detected.

Some example embodiments of the inventive concepts provide an operating method of a nonvolatile memory device including performing a first period of an operation, detecting a first power noise in which one of voltage sources provided to a memory cell array exceeds a first reference voltage and detecting a second power noise in which the one of the voltage sources is between the first reference voltage and a second reference voltage, again performing the first period of the operation after adjusting an operation condition of the first period of the operation in response to the second power noise being detected, performing a second period of the operation in response to the first and second power noises not being detected, detecting the first power noise or the second power noise during the second period of the operation, again performing the second period of the operation after adjusting an operation condition of the second period of the operation in response to the second power noise being detected, and performing a recovery period of the operation in response to the first power noise being detected during the first period or the second period of the operation.

Some example embodiments of the inventive concepts provide a memory system including a memory device and a memory controller. The memory device configured to detect a first power noise based on a voltage source and a first reference voltage, and detect a second power noise based on the voltage source and a second reference voltage. The memory controller configured to perform a first stage of an operation, and perform the first stage of the operation again in response to the memory device detecting the second power noise while the memory controller performs the first stage of the operation. The memory device is further configured to perform a recovery stage of the operation, in response to the memory device detecting the first power noise while the memory controller performs the first stage of the operation.

BRIEF DESCRIPTION OF THE FIGURES

The above and other objects and features will become apparent from the following description with reference to the following figures, wherein like reference numerals refer to like parts throughout the various figures unless otherwise specified, and wherein:

FIGS. 14 to 16 are drawings illustrating method of arranging power noise detection units, according to an example embodiment of the inventive concepts.

DETAILED DESCRIPTION

Below, some example embodiments of the inventive concepts may be described in detail and clearly to such an extent that one having ordinary skill in the art may implement the inventive concepts.

Figure 1:
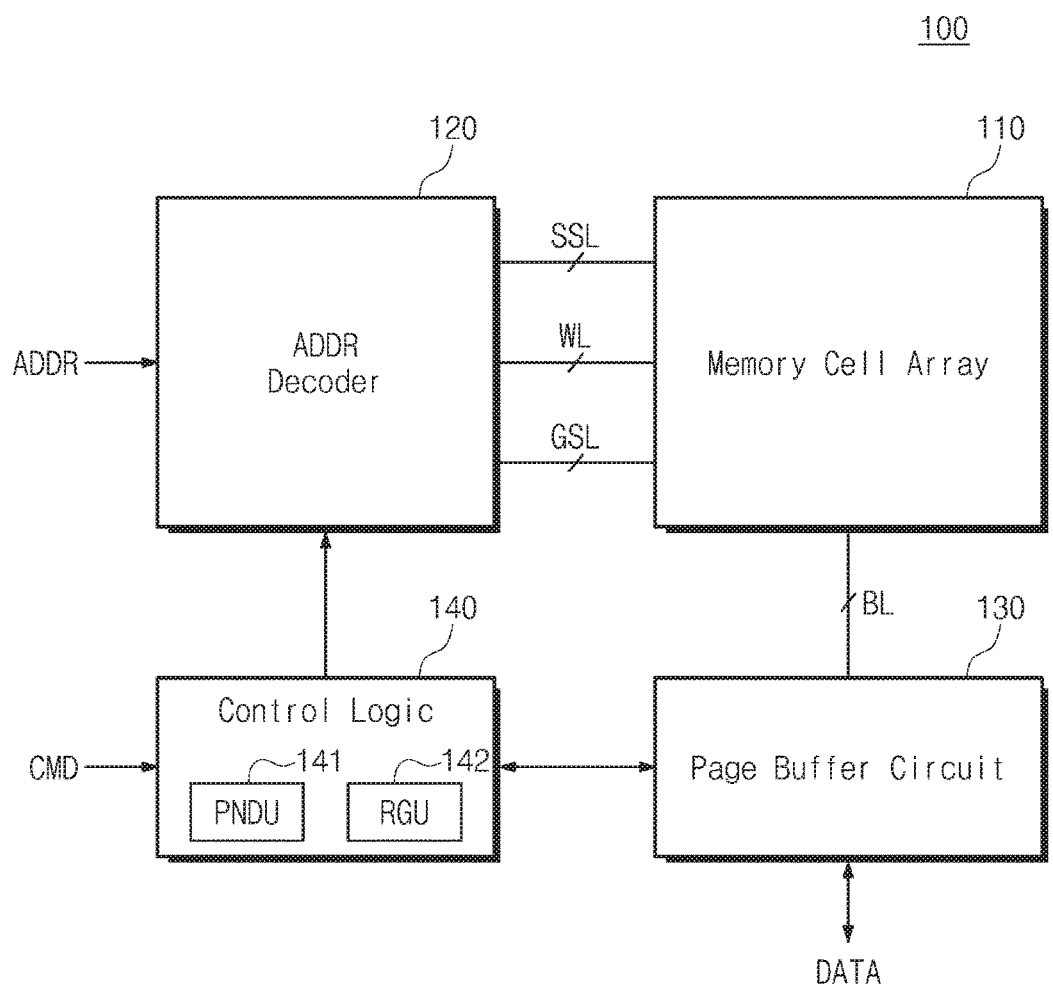
FIG. 1 is a block diagram illustrating a nonvolatile memory device, according to an example embodiment of the inventive concepts.

FIG. 1 is a block diagram illustrating a nonvolatile memory device, according to an example embodiment of the inventive concepts. Referring to FIG. 1, a nonvolatile memory device 100 may include a memory cell array 110, an address decoder 120, a page buffer circuit 130, and control logic 140.

The memory cell array 110 may be connected to the address decoder 120 and the page buffer circuit 130. For example, the memory cell array 110 may be connected to the address decoder 120 through string selection lines SSL, word lines WL, and ground selection lines GSL. Meanwhile, the memory cell array 110 may be connected to the page buffer circuit 130 through bit lines BL.

The memory cell array 110 may include a plurality of memory blocks. Memory cells of each memory block are arranged to have a two-dimensional structure. In addition, the memory cells of each memory block are arranged to have a three-dimensional (3D) structure in which the memory cells are stacked in a direction perpendicular to a substrate. Each memory block may include a plurality of memory cells and a plurality of selection transistors. The memory cells may be connected to the word lines WL, and selection transistors may be connected to the string selection lines SSL or the ground selection lines GSL. Memory cells of each memory block may store one or more bits.

As an example embodiment of the inventive concepts, the memory cell array 110 may be implemented with a 3D memory array. The 3D memory array may be monolithically formed in one or more physical level(s) of a memory cell array having an active area arranged on a circuit related on a silicon substrate and an operation of memory cells. The circuit related to an operation of memory cells may be located in a substrate or on a substrate. The term "monolithic" means that layers of each level of the array are directly deposited on the layers of each underlying level of the array.

In an example embodiment of the inventive concepts, the 3D memory array includes vertical NAND strings that are vertically oriented such that at least one memory cell is located over another memory cell. The at least one memory cell may comprise a charge trap layer. Each vertical NAND string may include at least one selection transistor located over memory cells. At least one selection transistor may have the same structure as those of memory cells and may be monolithically formed together with memory cells.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

The address decoder 120 may be connected to the memory cell array 110 through a plurality of lines. For example, the plurality of lines may include the string selection lines SSL, the word lines WL, and the ground selection lines GSL. The address decoder 120 may be configured to operate under control of the control logic 140.

The address decoder 120 may receive an address ADDR from the outside. The address decoder 120 may decode a row address of the address ADDR. The address decoder 120 may select a word line corresponding to the decoded row address. The address decoder 120 may select a word line corresponding to the address ADDR, based on the decoded row address.

During an erase operation, the address decoder 120 may select a memory block to be erased. The address decoder 120 may apply bias voltages to some of the plurality of lines and may float the remaining lines. Time points, at which the remaining lines of the plurality of lines are floated, may be respectively determined by the control logic 140. In an example embodiment, a word line erase voltage may be applied to each word line of a selected memory block. An erase voltage may be applied to a substrate or a pocket well of the memory cell array 110. In the case of using a GSL delayed scheme, ground selection lines may be floated after a specific delay time elapses from a point in time when the erase voltage is applied to the substrate or pocket well.

The address decoder 120 may be configured to decode a column address of the received address ADDR. The address decoder 120 may transmit the decoded column address to the page buffer circuit 130. In an example embodiment, the address decoder 120 may include a row decoder for decoding a row address, a column decoder for decoding a column address, and an address buffer for storing the address ADDR.

The page buffer circuit 130 may be connected to the memory cell array 110 through the bit lines BL. The page buffer circuit 130 operates under control of the control logic 140. The page buffer circuit 130 may receive the decoded column address from the address decoder 120. The page buffer circuit 130 may select the bit lines BL by using the decoded column address.

In an example embodiment, the page buffer circuit 130 may receive data from the outside and may mite the received data in the memory cell array 110. The page buffer circuit 130 reads data from the memory cell array 110 and transmits the read data to the outside. The page buffer circuit 130 may read data from a first storage area of the memory cell array 110 and may write the read data in a second storage area of the memory cell array 110. For example, the page buffer circuit 130 may be configured to perform a copy-back operation.

The control logic 140 may be connected to the address decoder 120 and the page buffer circuit 130. The control logic 140 may be configured to control overall operations of the nonvolatile memory device 100. The control logic 140 may operate in response to a command CMD transmitted from the outside.

In an example embodiment, the control logic 140 may include a power noise detection unit (PNDU) 141 and a register unit (RGU) 142. The power noise detection unit 141 may detect power noises generated in the nonvolatile memory device 100. For example, the power noises may be generated due to internal or external factors. The power noises may include noises that are associated with a power supply voltage VDD, a ground voltage GND, and an external voltage eVPP.

If a power noise is generated, the nonvolatile memory device 100 may erroneously operate. However, the operation error due to the power noise may be transient. Accordingly, the operation error due to the power noise may differ from an operation error due to a physical defect of the nonvolatile memory device 100. A memory page or memory block in which an operation error due to the physical defect is generated may be set to an unusable state permanently. However, in the case where an operation error due to the power noise is generated, the nonvolatile memory device 100 may solve the operation error due to the power noise by changing an operation condition or performing an operation again. With the above description, the nonvolatile memory device 100 may need to separately process an operation error due to a physical defect and an operation error due to a power noise.

The power noise detection unit 141 may detect a power noise by using two reference voltages and may classify the power noise as a strong power noise or a weak power noise based on the detection result. Also, the power noise detection unit 141 may store the detection result in the register unit 142. The nonvolatile memory device 100 may again perform operation periods of a read, program, or erase operation. In an example embodiment, the nonvolatile memory device 100 may send information about memory blocks, in which the strong power noise and the weak power noise are generated, to a controller. The operation periods may also be operation stages or parts of the operation. The operation periods need not be defined by a certain time.

The nonvolatile memory device 100 may perform a program operation in an incremental step pulse programming (ISPP) scheme. For example, the nonvolatile memo device 100 may stepwise increase a program voltage to be applied to a selected word line in the program operation. Meanwhile, the nonvolatile memory device 100 may perform a program operation in an incremental step pulse erase (ISPE) scheme. For example, the nonvolatile memory device 100 may stepwise increase an erase voltage to be applied to a substrate or pocket well in the erase operation.

Figure 2:
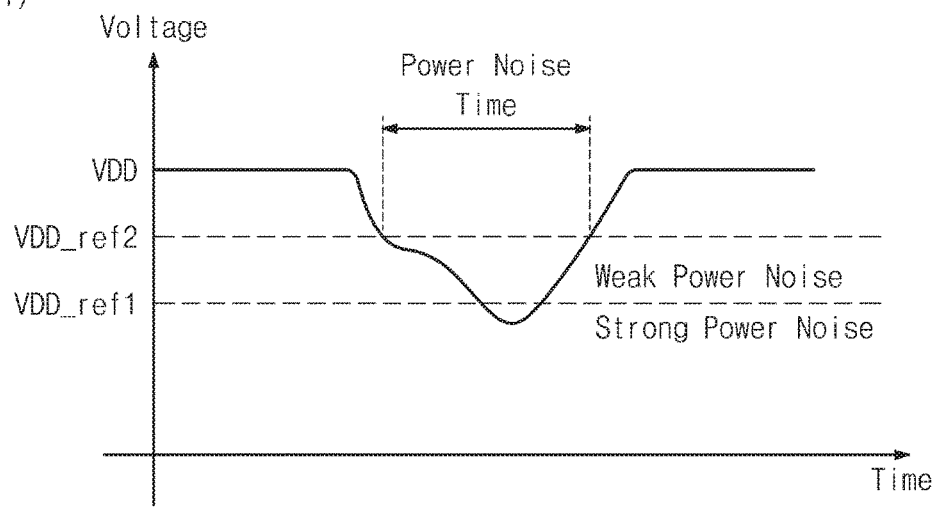
FIG. 2 is a drawing illustrating a method of measuring a power noise, according to an example embodiment of the inventive concepts.
Figure 2:
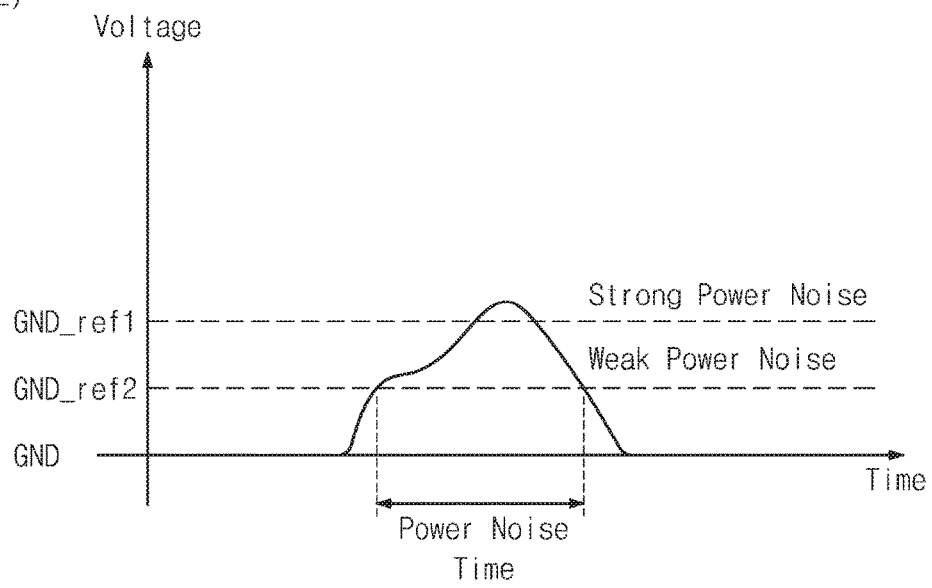

FIG. 2 is a drawing illustrating a method of measuring a power noise, according to an example embodiment of the inventive concepts. Referring to FIG. 2, a first case corresponds to the case where a power noise is generated at a power supply voltage VDD, and a second case corresponds to the case where a power noise is generated at a ground voltage GND.

In the first case, the nonvolatile memory device 100 may detect a power noise by using first and second power reference voltages VDD_ref1 and VDD_ref2. For example, the power noise of the power supply voltage VDD may decrease in a specific period. However, the power noise is not limited thereto. For example, the power noise of the power supply voltage VDD may increase in a specific period. Below, the case where a level of the power supply voltage VDD decreases is described as an example. The nonvolatile memory device 100 may determine that the power supply voltage VDD is lower than the first power reference voltage VDD_ref1, as the strong power noise. The nonvolatile memory device 100 may determine that the power supply voltage VDD is higher than the first power reference voltage VDD_ref1 and is lower than the second power reference voltage VDD_ref2, as the weak power noise. A power noise time is defined as a period that the power supply voltage VDD is lower than the second power reference voltage VDD_ref2.

In the second case, the nonvolatile memory device 100 may detect a power noise by using first and second ground reference voltages GND_ref1 and GND_ref2. For example, the power noise of the ground voltage GND may increase in a specific period. However, the power noise is not limited thereto. For example, the power noise of the ground voltage GND may decrease in a specific period. Below, the case where a level of the ground voltage GND increases is described as an example. The nonvolatile memory device 100 may determine that the ground voltage GND is higher than the first ground reference voltage GND_ref1, as the strong power noise. The nonvolatile memory device 100 may determine that the ground voltage GND is lower than the first ground reference voltage GND_ref1 and is higher than the second ground reference voltage GND_ref2, as the weak power noise. A power noise time is defined as a period that the ground voltage GND is lower than the second ground reference voltage GND_ref2.

Figure 3:
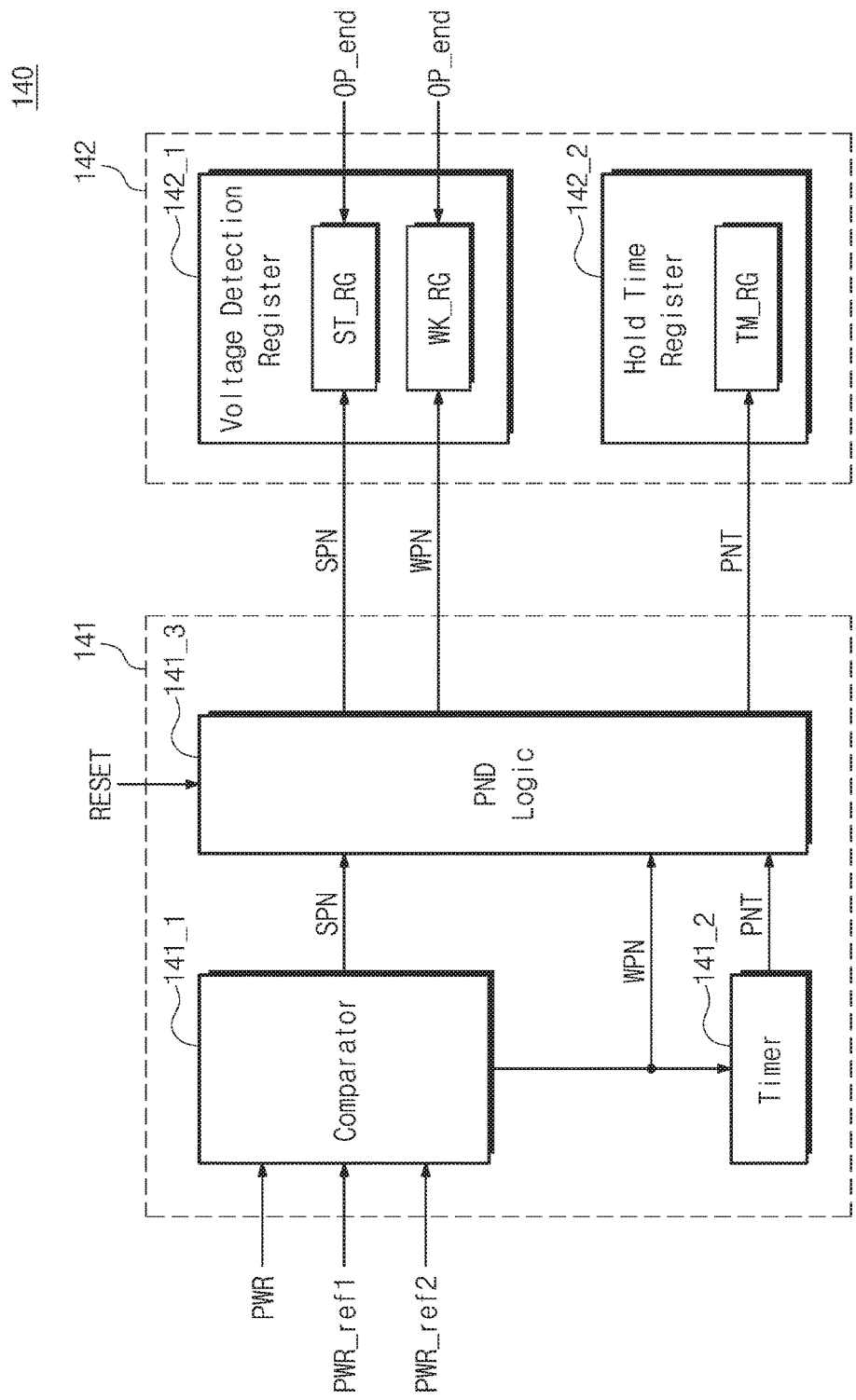
FIG. 3 is a block diagram illustrating a power noise detection unit and a register unit of FIG. 1.

FIG. 3 is a block diagram illustrating a power noise detection unit and a register unit of FIG. 1. Referring to FIG. 3, the power noise detection unit 141 may include a comparator 141_1, a timer 141_2, and power noise detection (PND) logic 141_3. The register unit 142 may include a voltage detection register 142_1 and a hold time register 142_2.

The power noise detection unit 141 may detect the strong power noise and the weak power noise by comparing a level of power PWR used in the nonvolatile memory device 100 with first and second reference voltages PWR_ref1 and PWR_ref2. For example, the power PWR may include the power supply voltage VDD, the ground voltage GND, and the external voltage eVPP. The first and second reference voltages PWR_ref1 and PWR_ref2 may include reference voltages that correspond to each of the power supply voltage VDD, the ground voltage GND, and the external voltage eVPP.

The comparator 141_1 may compare the level of the power PWR with the first and second reference voltages PWR_ref1 and PWR_ref2. For example, the power noise detection unit 141 may differently set the first and second reference voltages PWR_ref1 and PWR_ref2 based on a generation aspect of the power noise. In the case that the level of the power PWR of the power noise increases, the power noise detection unit 141 may use the first and second reference voltages PWR_ref1 and PWR_ref2 that are higher than the power PWR. In the case that the level of the power PWR of the power noise decreases, the power noise detection unit 141 may use the first and second reference voltages PWR_ref1 and PWR_ref2 that are lower than the power PWR.

In the case that the level of the power PWR of the power noise increases, if the level of the power PWR is higher than the first reference voltage PWR_ref1, the comparator 141_1 may output a strong power noise signal SPN. If the level of the power PWR is higher than the second reference voltage PWR_ref2 and is lower than the first reference voltage PWR_ref1, the comparator 141_1 may output a weak power noise signal WPN.

In the case that the level of the power PWR of the power noise decreases, if the level of the power PWR is lower than the first reference voltage PWR_ref1, the comparator 141_1 may output the strong power noise signal SPN. If the level of the power PWR is lower than the second reference voltage PWR_ref2 and is higher than the first reference voltage PWR_ref1, the comparator 141_1 may output the weak power noise signal WPN.

The power noise detection logic 141_3 may receive the strong power noise signal SPN and the weak power noise signal WPN. For example, the power noise detection logic 141_3 may store the strong power noise signal SPN and the weak power noise signal WPN in the voltage detection register 142_1. The power noise detection logic 141_3 may store the strong power noise signal SPN in a strong noise register ST_RG. The power noise detection logic 141_3 may store the weak power noise signal WPN in a weak noise register WK_RG. The power noise detection logic 141_3 may include temporary registers that temporarily store the strong power noise signal SPN and the weak power noise signal WPN. The temporary registers may be reset by a reset signal RESET and may store another strong power noise signal SPN and another weak power noise signal WPN. The strong noise register ST_RG and the weak noise register WK_RG may hold current data based on an operation end signal OP_end after storing the strong power noise signal SPN and the weak power noise signal WPN. The control logic 140 may generate the operation end signal OP_end to hold a current data of a register.

The timer 141_2 may receive the weak power noise signal WPN. For example, the timer 141_2 may measure a duration of the weak power noise signal WPN. The timer 141_2 may output a power noise time signal PNT of the weak power noise signal WPN. The power noise time signal PNT may correspond to a power noise time of FIG. 2. The power noise detection logic 141_3 may receive and store the power noise time signal PNT in a hold time register 142_2. The power noise detection logic 141_3 may further include a temporary register that temporarily stores the power noise time signal PNT. The temporary register may be reset by the reset signal RESET and may store another power noise time signal PNT.

Figure 4:
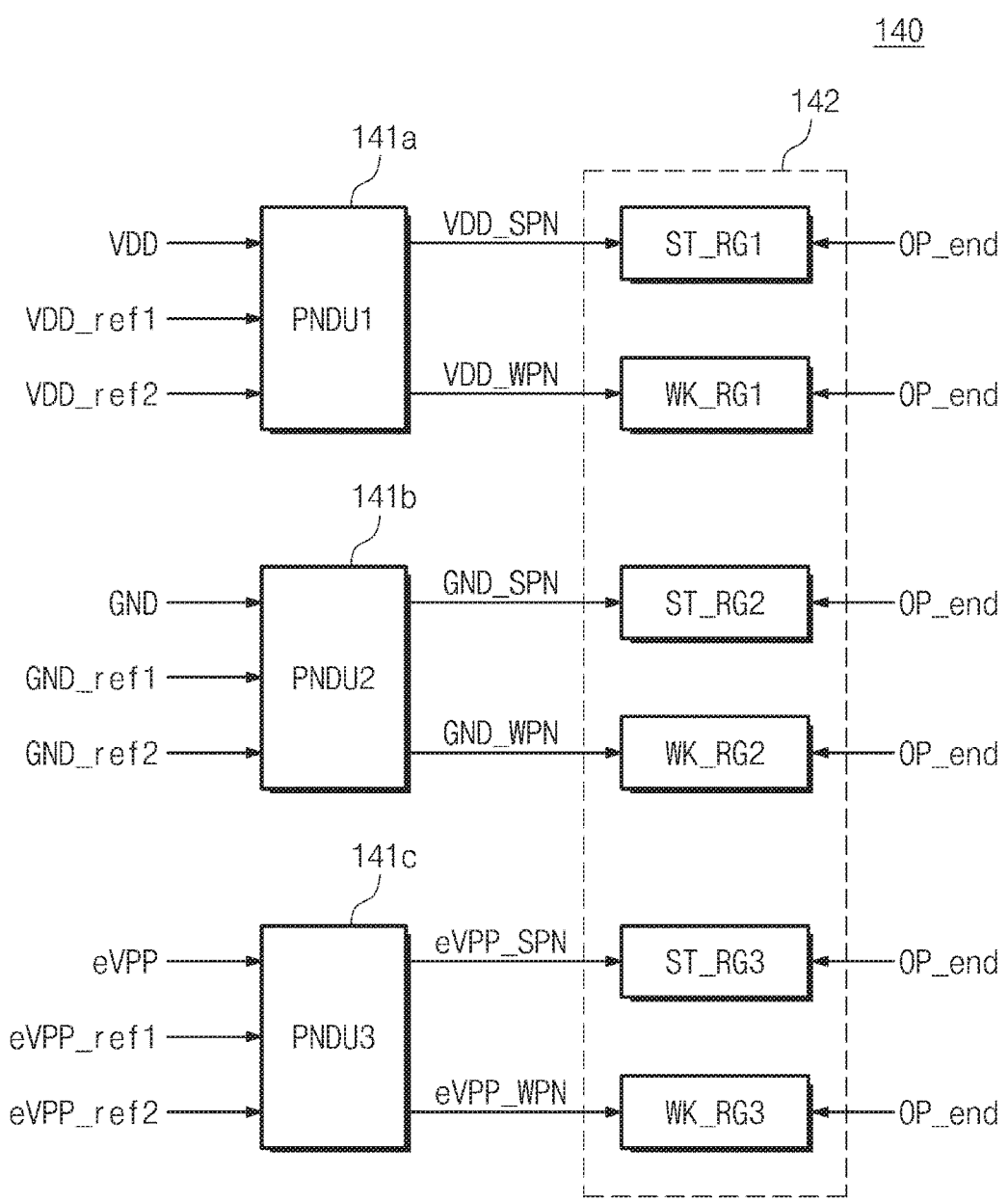
FIG. 4 is a block diagram illustrating a plurality of power noise detection units that detect power noises for respective power sources, according to an example embodiment of the inventive concepts.

FIG. 4 is a block diagram illustrating a plurality of power noise detection units that detect power noises for respective power sources, according to an example embodiment of the inventive concepts. Referring to FIG. 4, the control logic 140 may include a plurality of, for example, first, second, and third power noise detection units 141a, 141b, and 141c.

For example, the first power noise detection unit 141a may detect a power noise of the power supply voltage VDD. The first power noise detection unit 141a may detect a power noise of the power supply voltage VDD by using first and second power reference voltages VDD_ref1 and VDD_ref2. The power noise of the power supply voltage VDD may decrease in a specific period. However, the power noise is not limited thereto. For example, the power noise of the power supply voltage VDD may increase in a specific period. Below, the case where a level of the power supply voltage VDD decreases is described as an example. The first power noise detection unit 141a may output a strong power noise signal VDD_SPN when the power supply voltage VDD is lower than the first power reference voltage VDD_ref1. The strong power noise signal VDD_SPN may be stored in a first strong noise register ST_RG1. The first power noise detection unit 141a may output a weak power noise signal VDD_WPN when the power supply voltage VDD is higher than the first power reference voltage VDD_ref1 and is lower than the second power reference voltage VDD_ref2. The weak power noise signal VDD_WPN may be stored in a first weak noise register WK_RG1.

For example, the second power noise detection unit 141b may detect a power noise of the ground voltage GND. The second power noise detection unit 141b may detect a power noise of the ground voltage GND by using first and second ground reference voltages GND_ref1 and GND_ref2. The power noise of the ground voltage GND may increase in a specific period. However, the power noise is not limited thereto. For example, the power noise of the ground voltage GND may decrease in a specific period. Below, the case where a level of the ground voltage GND increases is described as an example. The second power noise detection unit 141b may output a strong ground noise signal GND_SPN when the ground voltage GND is higher than the first ground reference voltage GND_ref1. The strong ground noise signal GND_SPN may be stored in a second strong noise register ST_RG2. The second power noise detection unit 141b may output a weak ground noise signal GND_WPN when the ground voltage GND is lower than the first ground reference voltage GND_ref1 and is higher than the second ground reference voltage GND_ref2. The weak ground noise signal GND_WPN may be stored in a second weak noise register WK_RG2.

For example, the third power noise detection unit 141c may detect a power noise of the external voltage eVPP. The third power noise detection unit 141c may detect a power noise of the external voltage eVPP by using first and second external reference voltages eVPP_ref1 and eVPP_ref2. The power noise of the external voltage eVPP may decrease in a specific period. However, the power noise is not limited thereto. The power noise of the external voltage eVPP may increase in a specific period. Below, the case where a level of the external voltage eVPP decreases is described as an example. The third power noise detection unit 141c may output a strong external noise signal eVPP_SPN when the external voltage eVPP is lower than the first external reference voltage eVPP_ref1. The strong external noise signal eVPP_SPN may be stored in a third strong noise register ST_RG3. The third power noise detection unit 141c may output a weak external noise signal eVPP_WPN when the external voltage eVPP is higher than the first external reference voltage evPP_ref1 and is lower than the second external reference voltage eVPP_ref2. The weak external noise signal eVPP_WPN may be stored in a third weak noise register WK_RG3.

The strong noise registers ST_RG1, ST_RG2, and ST_RG3 and the weak noise registers WK_RG1, WK_RG2, and WK_RG3 may hold currently stored data in response to the operation end signal OP_end.

Figure 5:
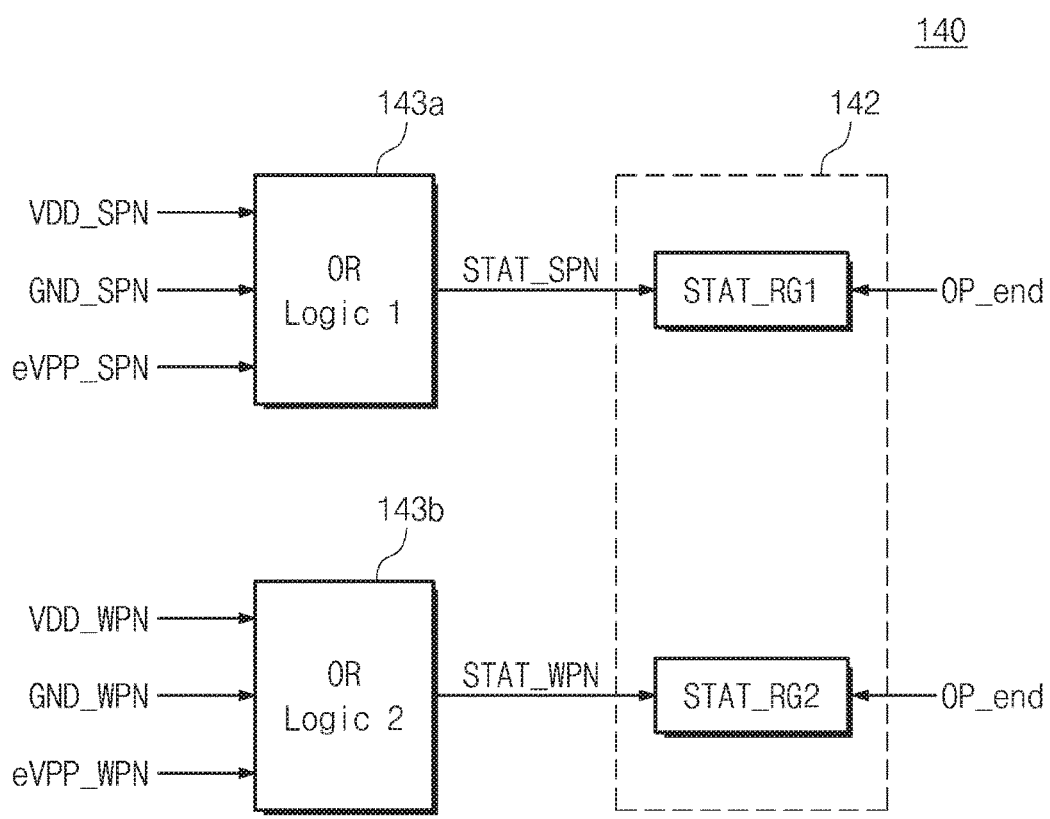
FIG. 5 is a block diagram illustrating OR logics for indicating whether power noises are generated, according to an example embodiment of the inventive concepts.

FIG. 5 is a block diagram illustrating OR logics for indicating whether power noises are generated, according to an example embodiment of the inventive concepts. Referring to FIG. 5, the control logic 140 may include first and second OR logics 143a and 143b. Status registers STAT_RG1 and STAT_RG2 may be included in the register unit 142.

The first OR logic 143a may receive the strong power noise signal VDD_SPN, the strong ground noise signal GND_SPN, and the strong external noise signal eVPP_SPN. If the first OR logic 143a receives at least one of the strong power noise signal VDD_SPN, the strong ground noise signal GND_SPN, and the strong external noise signal eVPP_SPN, the first OR logic 143a may output a strong noise status signal STAT SPN to the first status register STAT_RG1. The first status register STAT_RG1 may hold currently stored data in response to the operation end signal OP_end.

The second OR logic 143b may receive the weak power noise signal VDD_WPN, the weak ground noise signal GND_WPN, and the weak external noise signal eVPP_WPN. If the second OR logic 143b receives at least one of the weak power noise signal VDD_WPN, the weak ground noise signal GND_WPN, and the weak external noise signal eVPP_WPN, the second OR logic 143b may output a weak noise status signal STAT_WPN to the second status register STAT_RG2. The second status register STAT_RG2 may hold currently stored data in response to the operation end signal OP_end.

Figure 6:
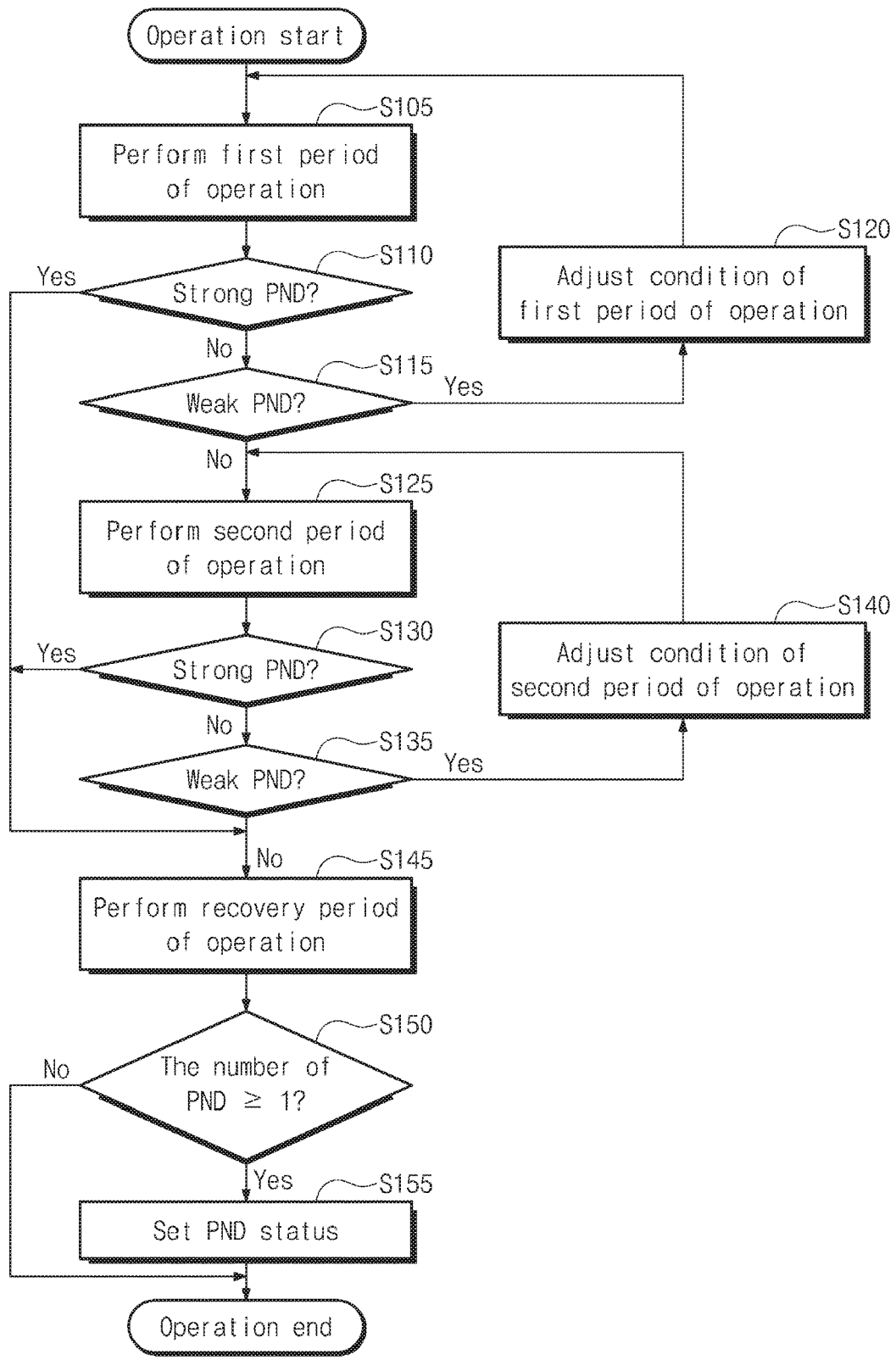
FIG. 6 is a flowchart illustrating an operating method of a nonvolatile memory device using power noise detection, according to an example embodiment of the inventive concepts.

FIG. 6 is a flowchart illustrating an operating method of a nonvolatile memory device using power noise detection, according to an example embodiment of the inventive concepts. Referring to FIG. 6, the nonvolatile memory device 100 may perform an operation including at least one period. The operation may include a read operation, a program operation, an erase operation, etc.

In operation S105, the nonvolatile memory device 100 may perform a first period of the operation. In operation S110, the nonvolatile memory device 100 may determine whether a strong power noise is detected during the first period. For example, as described with reference to FIGS. 1 to 5, the power noise detection unit 141 may compare a level of the power PWR with the first reference voltage PWR_ref1. If the strong power noise is detected, the nonvolatile memory device 100 may immediately move to operation S145, in which a recovery period of the operation is performed. If the strong power noise is not detected, the process proceeds to operation S115.

In operation S115, the nonvolatile memory device 100 may determine whether a weak power noise is detected during the first period. For example, as described with reference to FIGS. 1 to 5, the power noise detection unit 141 may compare the level of the power PWR with the first and second reference voltage PWR_ref1 and PWR_ref2. If the weak power noise is detected, the nonvolatile memory device 100 may move to operation S120, in which operation conditions of the first period of the operation are adjusted. After the nonvolatile memory device 100 adjusts the operation conditions of the first period of the operation, the nonvolatile memory device 100 may again perform the first period (operation S105 to operation S115). If the weak power noise is not detected, the process proceeds to operation S125.

In operation S125, the nonvolatile memory device 100 may perform a second period of the operation. In operation S130, the nonvolatile memory device 100 may determine whether the strong power noise is detected during the second period. For example, as described with reference to FIGS. 1 to 5, the power noise detection unit 141 may compare the level of the power PWR with the first reference voltage PWR_ref1. If the strong power noise is detected, the nonvolatile memory device 100 may immediately move to operation S145, in which a recovery period of the operation is performed. If the strong power noise is not detected, the process proceeds to operation S135.

In operation S135, the nonvolatile memory device 100 may determine whether the weak power noise is detected during the second period. For example, as described with reference to FIGS. 1 to 5, the power noise detection unit 141 may compare the level of the power PWR with the first and second reference voltage PWR_ref1 and PWR_ref2. If the weak power noise is detected, the nonvolatile memory device 100 may move to operation S140, in which operation conditions of the second period of the operation are adjusted. After the nonvolatile memory device 100 adjusts the operation conditions of the second period of the operation, the nonvolatile memory device 100 may again perform the second period (operation S125 to operation S135). If the weak power noise is not detected, the process proceeds to operation S145.

In operation S145, the nonvolatile memory device 100 may perform a recovery period of the operation. For example, the nonvolatile memory device 100 may reset changed voltages and may deactivate a voltage pump.

In operation S150, the nonvolatile memory device 100 may determine the number of times that a power noise is detected. The nonvolatile memory device 100 completes the operation when the power noise is not detected. If the power noise is detected at least once, the process proceeds to operation S155, in which the nonvolatile memory device 100 sets the corresponding memory block to a power noise detection status. For example, if the power noise is generated at least once, an error may be generated in the corresponding memory block. However, the error may be different from an error due to a physical defect. Accordingly, the nonvolatile memory device 100 may reuse the memory block, which is set to the power noise detection status, after error correction.

Figure 7:
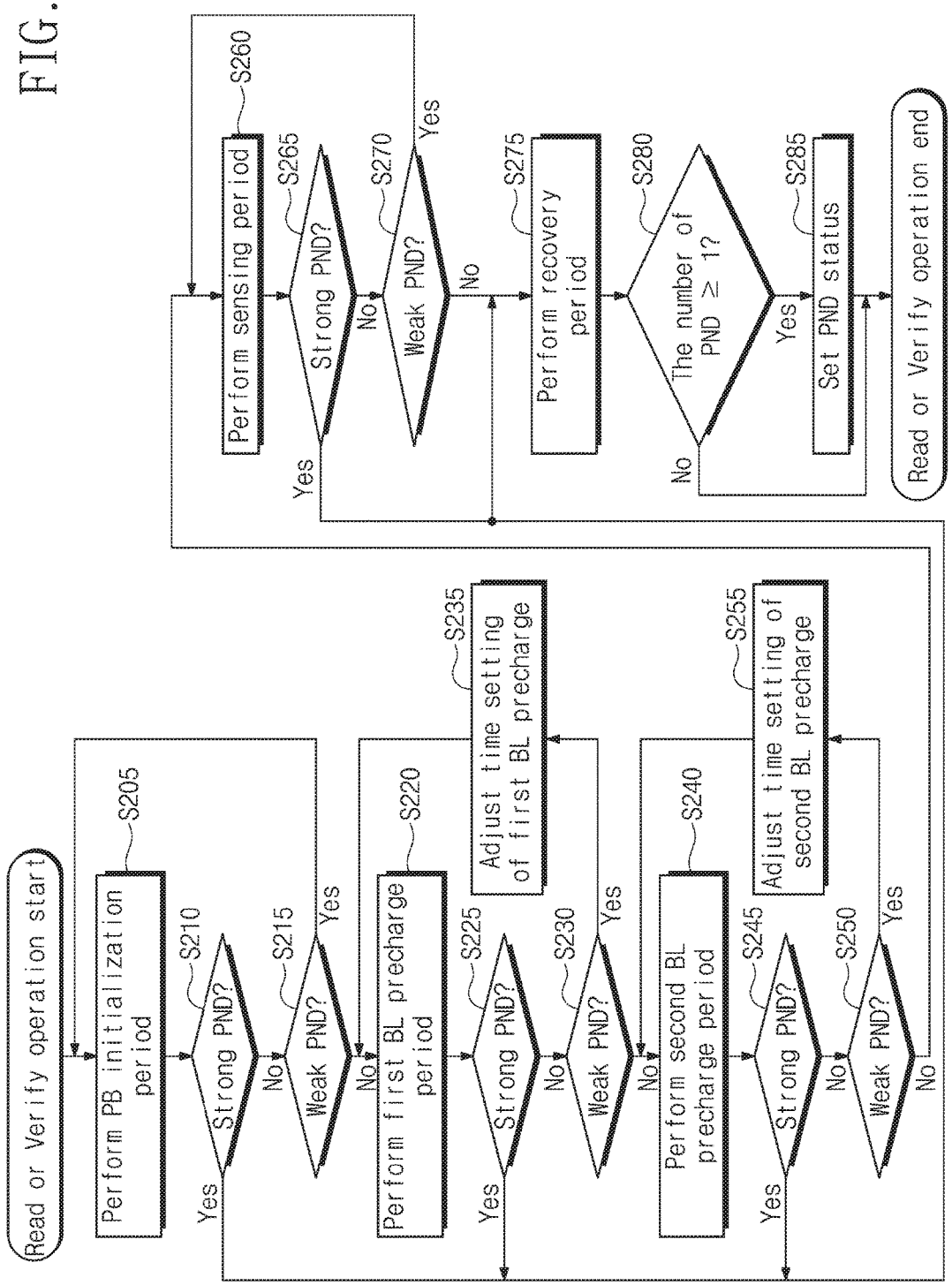
FIG. 7 is a flowchart illustrating a read or verify method of a nonvolatile memory device, according to an example embodiment of the inventive concepts.

FIG. 7 is a flowchart illustrating a read or verify operation of a nonvolatile memory device, according to an example embodiment of the inventive concepts. Referring to FIG. 7, when the nonvolatile memory device 100 detects a power noise in a bit line precharge period, the nonvolatile memory device 100 may again perform the bit line precharge period after adjusting a precharge time. Also, if the strong power noise is detected in all operation periods, the nonvolatile memory device 100 may perform a recovery period immediately.

In operation S205, the nonvolatile memory device 100 may perform a page buffer initialization period. In operation S210, the nonvolatile memory device 100 may determine whether the strong power noise is detected during the page buffer initialization period. If the strong power noise is detected, the nonvolatile memory device 100 may immediately move to operation S275, in which a recovery period of the read or verify operation is performed. If the strong power noise is not detected, the process proceeds to operation S215.

In operation S215, the nonvolatile memory device 100 may determine whether the weak power noise is detected during the page buffer initialization period. If the weak power noise is detected, the nonvolatile memory device 100 may move to operation S205, in which the page buffer initialization period is again performed. If the weak power noise is not detected, the process proceeds to operation S220.

In operation S220, the nonvolatile memory device 100 may perform a first bit line precharge period. In operation S225, the nonvolatile memory device 100 may determine whether the strong power noise is detected during the first bit line precharge period. If the strong power noise is detected, the nonvolatile memory device 100 may immediately move to operation S275, in which a recovery period of the read or verify operation is performed. If the strong power noise is not detected, the process proceeds to operation S230.

In operation S230, the nonvolatile memory device 100 may determine whether the weak power noise is detected during the first bit line precharge period. If the weak power noise is detected, the nonvolatile memory device 100 may move to operation S235, in which a time setting of the first bit line precharge period is adjusted. After the nonvolatile memory device 100 adjusts the time setting of the first bit line precharge period, the nonvolatile memory device 100 may again perform the second bit line precharge period (operation S220 to operation S230). If the weak power noise is not detected, the process proceeds to operation S240.

In operation S240, the nonvolatile memory device 100 may perform a second bit line precharge period. In operation S245, the nonvolatile memory device 100 may determine whether the strong power noise is detected during the second bit line precharge period. If the strong power noise is detected, the nonvolatile memory device 100 may immediately move to operation S275, in which a recovery period of the read or verify operation is performed. If the strong power noise is not detected, the process proceeds to operation S250.

In operation S250, the nonvolatile memory device 100 may determine whether the weak power noise is detected during the second bit line precharge period. If the weak power noise is detected, the nonvolatile memory device 100 may move to operation S255, in which a time setting of the second bit line precharge period is adjusted. After the nonvolatile memory device 100 adjusts the time setting of the second bit line precharge period, the nonvolatile memory device 100 may again perform the second bit line precharge period (operation S240 to operation S250). If the weak power noise is not detected, the process proceeds to operation S260.

In operation S260, the nonvolatile memory device 100 may perform a sensing period. In operation S265, the nonvolatile memory device 100 may determine whether the strong power noise is detected during the sensing period. If the strong power noise is detected, the nonvolatile memory device 100 may immediately move to operation S275, in which a recovery period of the read or verify operation is performed. If the strong power noise is not detected, the process proceeds to operation S270.

In operation S270, the nonvolatile memory device 100 may determine whether the weak power noise is detected during the sensing period. If the weak power noise is detected, the nonvolatile memory device 100 may move to operation S260, in which the sensing period is again performed. If the weak power noise is not detected, the process proceeds to operation S275.

In operation S275, the nonvolatile memory device 100 may perform a recovery period of the read or verify operation. For example, the nonvolatile memory device 100 may reset changed voltages and may deactivate a voltage pump.

In operation S280, the nonvolatile memory device 100 may determine the number of times that a power noise is detected. The nonvolatile memory device 100 completes the operation when the power noise is not detected. If the power noise is detected at least once, the process proceeds to operation S285, in which the nonvolatile memory device 100 sets the corresponding memory block to a power noise detection status. For example, if the power noise is generated at least once, an error may be generated in the corresponding memory block. However, the error may be different from an error due to a physical defect. Accordingly, the nonvolatile memory device 100 may reuse the memory block, which is set to the power noise detection status, after error correction.

Figure 8:
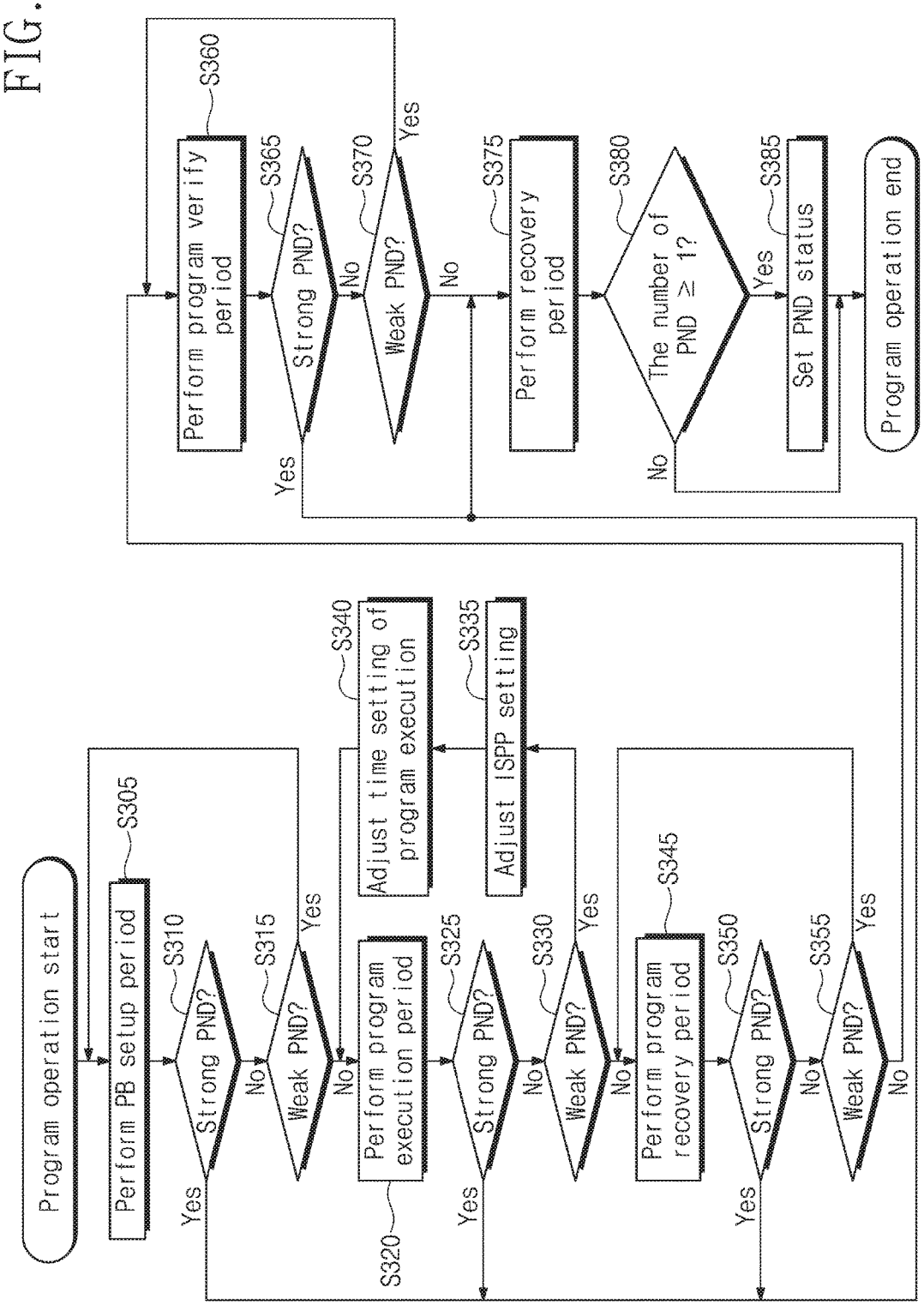
FIG. 8 is a flowchart illustrating a program method of a nonvolatile memory device, according to an example embodiment of the inventive concepts.

FIG. 8 is a flowchart illustrating a program operation of a nonvolatile memory device, according to an example embodiment of the inventive concepts. Referring to FIG. 8, when the nonvolatile memory device 100 detects a power noise in a program execution period, the nonvolatile memory device 100 may again perform the program execution period after adjusting an ISPP setting and a program time setting. Also, if the strong power noise is detected in all operation periods, the nonvolatile memory device 100 may perform a recovery period of the program operation immediately.

In operation S305, the nonvolatile memory device 100 may perform a bit line setup period. In operation S310, the nonvolatile memory device 100 may determine whether the strong power noise is detected during the bit line setup period. If the strong power noise is detected, the nonvolatile memory device 100 may immediately move to operation S375, in which a recovery period of the program operation is performed. If the strong power noise is not detected, the process proceeds to operation S315.

In operation S315, the nonvolatile memory device 100 may determine whether the weak power noise is detected during the bit line setup period. If the weak power noise is detected, the nonvolatile memory device 100 may move to operation S305, in which the bit line setup period is again performed. If the weak power noise is not detected, the process proceeds to operation S320.

In operation S320, the nonvolatile memory device 100 may perform the program execution period. In operation S325, the nonvolatile memory device 100 may determine whether the strong power noise is detected during the program execution period. If the strong power noise is detected, the nonvolatile memory device 100 may immediately move to operation S375, in which the recovery period of the program operation is performed. If the strong power noise is not detected, the process proceeds to operation S330.

In operation S330, the nonvolatile memory device 100 may determine whether the weak power noise is detected during the program execution period. If the weak power noise is detected, the nonvolatile memory device 100 may move to operation S335, in which the ISPP setting is adjusted. For example, the nonvolatile memory device 100 may change an increment of a step pulse voltage in the ISPP scheme. Afterwards, in operation S340, the nonvolatile memory device 100 may adjust the time setting of the program execution period. After the nonvolatile memory device 100 adjusts the time setting of the program execution period, the nonvolatile memory device 100 may again perform the program execution period (operation S320 to operation S330). If the weak power noise is not detected, the process proceeds to operation S345.

In operation S345, the nonvolatile memory device 100 may perform a program recovery period. For example, the program recovery period of operation S345 may be different from the recovery period of operation S375. In the program recovery period of operation S345, the nonvolatile memory device 100 may reset only voltages applied to the memory cell array 110, and the voltage pump maintains an active state. In operation S350, the nonvolatile memory device 100 may determine whether the strong power noise is detected during the program recovery period. If the strong power noise is detected, the nonvolatile memory device 100 may immediately move to operation S375, in which the recovery period of the program operation is performed. If the strong power noise is not detected, the process proceeds to operation S355.

In operation S355, the nonvolatile memory device 100 may determine whether the weak power noise is detected during the program recovery period. If the weak power noise is detected, the nonvolatile memory device 100 may move to operation S345, in which the program recovery period is again performed. If the weak power noise is not detected, the process proceeds to operation S360.

In operation S360, the nonvolatile memory device 100 may perform a program verify period. In operation S365, the nonvolatile memory device 100 may determine whether the strong power noise is detected during the program verify period. If the strong power noise is detected, the nonvolatile memory device 100 may immediately move to operation S375, in which the recovery period of the program operation is performed. If the strong power noise is not detected, the process proceeds to operation S370.

In operation S370, the nonvolatile memory device 100 may determine whether the weak power noise is detected during the program verify period. If the weak power noise is detected, the nonvolatile memory device 100 may move to operation S360, in which the program verify period is again performed. If the weak power noise is not detected, the process proceeds to operation S375.

In operation S375, the nonvolatile memory device 100 may perform the recovery period of the program operation. For example, the nonvolatile memory device 100 may reset changed voltages and may deactivate the voltage pump.

In operation S380, the nonvolatile memory device 100 may determine the number of times that a power noise is detected. The nonvolatile memory device 100 completes the operation when the power noise is not detected. If the power noise is detected at least once, the process proceeds to operation S385, in which the nonvolatile memory device 100 sets the corresponding memory block to a power noise detection status. For example, if the power noise is generated at least once, an error may be generated in the corresponding memory block. However, the error may be different from an error due to a physical defect. Accordingly, the nonvolatile memory device 100 may reuse the memory block, which is set to the power noise detection status, after error correction.

Figure 9:
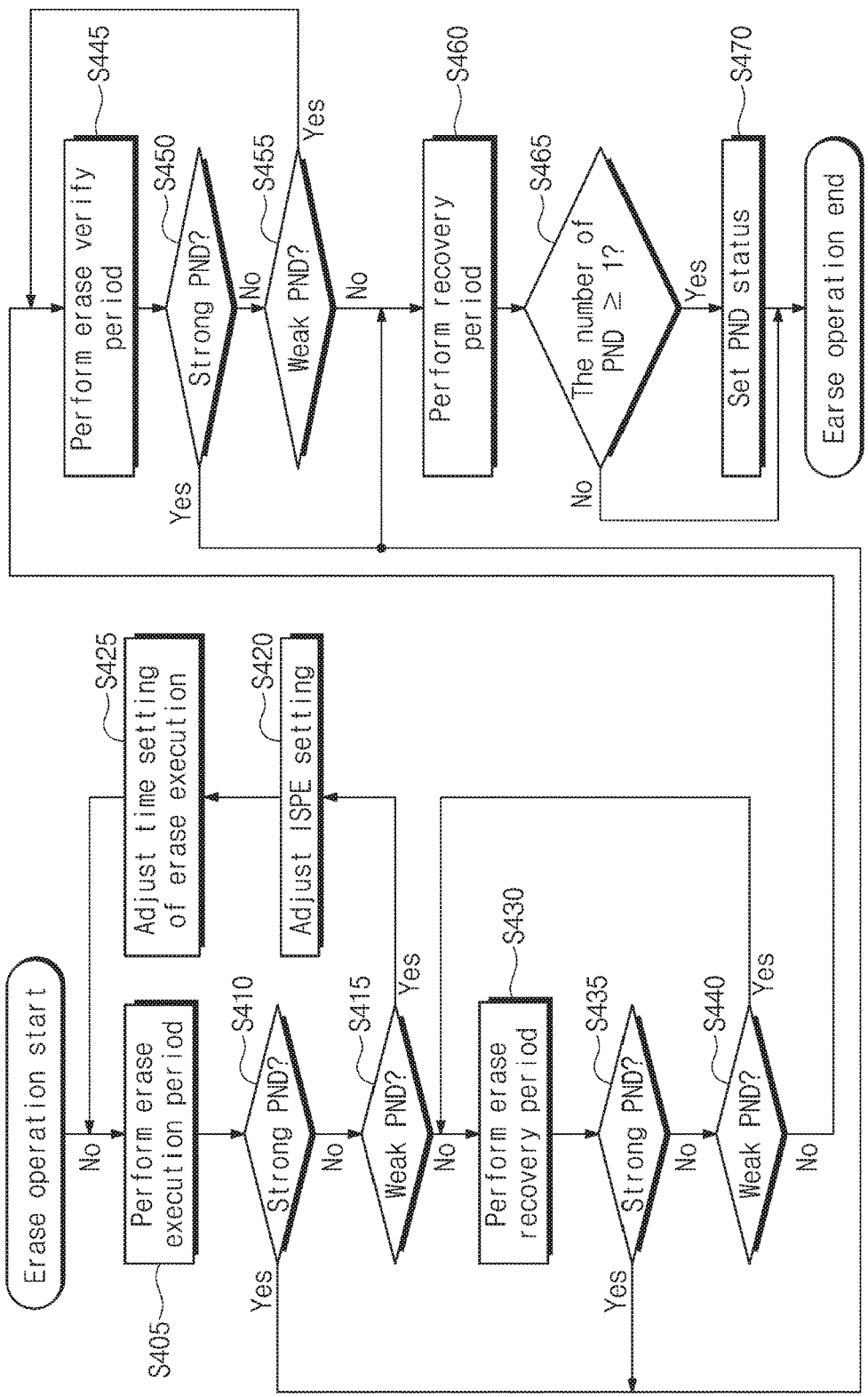
FIG. 9 is a flowchart illustrating an erase method of a nonvolatile memory device, according to an example embodiment of the inventive concepts.

FIG. 9 is a flowchart illustrating an erase operation of a nonvolatile memory device, according to an example embodiment of the inventive concepts. Referring to FIG. 9, when the nonvolatile memory device 100 detects a weak power noise in an erase execution period, the nonvolatile memory device 100 may again perform the erase execution period after adjusting an ISPE setting and an erase time setting. Also, if the strong power noise is detected in all operation periods, the nonvolatile memory device 100 may perform a recovery period of the erase operation immediately.

In operation S405, the nonvolatile memory device 100 may perform the erase execution period. In operation S410, the nonvolatile memory device 100 may determine whether the strong power noise is detected during the erase execution period. If the strong power noise is detected, the nonvolatile memory device 100 may immediately move to operation S460, in which a recovery period of the erase operation is performed. If the strong power noise is not detected, the process proceeds to operation S415.

In operation S415, the nonvolatile memory device 100 may determine whether the weak power noise is detected during the erase execution period. If the weak power noise is detected, the nonvolatile memory device 100 may move to operation S420, in which the ISPE setting is adjusted. For example, the nonvolatile memory device 100 may change an increment of a step pulse voltage in the ISPE scheme. Afterwards, in operation S425, the nonvolatile memory device 100 may adjust the time setting of the erase execution period. After the nonvolatile memory device 100 adjusts the time setting of the erase execution period, the nonvolatile memory device 100 may again perform the erase execution period (operation S405 to operation S415). If the weak power noise is not detected, the process proceeds to operation S430.

In operation S430, the nonvolatile memory device 100 may perform an erase recover period. For example, the erase recovery period of operation S430 may be different from the recovery period of operation S460. In the erase recovery period of operation S430, the nonvolatile memory device 100 may reset only voltages applied to the memory cell array 110, and the voltage pump maintains an active state. In operation S435, the nonvolatile memory device 100 may determine whether the strong power noise is detected during the erase execution period. If the strong power noise is detected, the nonvolatile memory device 100 may immediately move to operation S460, in which the recovery period of the erase operation is performed. If the strong power noise is not detected, the process proceeds to operation S440.

In operation S440, the nonvolatile memory device 100 may determine whether the weak power noise is detected during the erase recovery period. If the weak power noise is detected, the nonvolatile memory device 100 may move to operation S430, in which the erase recovery period is again performed. If the weak power noise is not detected, the process proceeds to operation S445.

In operation S445, the nonvolatile memory device 100 may perform an erase verify period. In operation S450, the nonvolatile memory device 100 may determine whether the strong power noise is detected during the erase verify period. If the strong power noise is detected, the nonvolatile memory device 100 may immediately move to operation S460, in which the recovery period of the erase operation is performed. If the strong power noise is not detected, the process proceeds to operation S455.

In operation S455, the nonvolatile memory device 100 may determine whether the weak power noise is detected during the erase verify period. If the weak power noise is detected, the nonvolatile memory device 100 may move to operation S445, in which the erase verify period is again performed. If the weak power noise is not detected, the process proceeds to operation S460.

In operation S460, the nonvolatile memory device 100 may perform a recovery period of the erase operation. For example, the nonvolatile memory device 100 may reset changed voltages and may deactivate the voltage pump.

In operation S465, the nonvolatile memory device 100 may determine the number of times that a power noise is detected. The nonvolatile memory device 100 completes the operation when the power noise is not detected. If the power noise is detected at least once, the process proceeds to operation S470, in which the nonvolatile memory device 100 sets the corresponding memory block to a power noise detection status. For example, if the power noise is generated at least once, an error may be generated in the corresponding memory block. However, the error may be different from an error due to a physical defect. Accordingly, the nonvolatile memory device 100 may reuse the memory block, which is set to the power noise detection status, after error correction.

Figure 10:
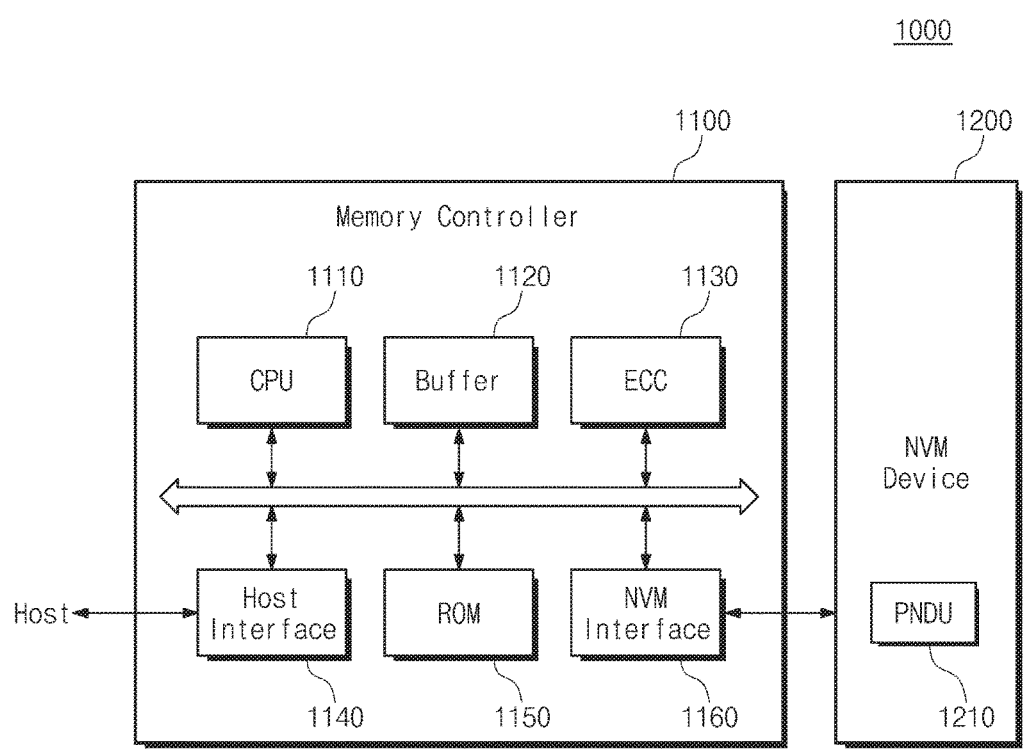
FIG. 10 is a block diagram illustrating a memory system, according to an example embodiment of the inventive concepts.

FIG. 10 is a block diagram illustrating a memory system, according to an example embodiment of the inventive concepts. Referring to FIG. 10, a memory system 1000 may include a memory controller 1100 and a nonvolatile memory device 1200.

The memory controller 1100 may provide an interface between the nonvolatile memory device 1200 and a host. The memory controller 1100 may be implemented to drive firmware for controlling the nonvolatile memory device 1200. The memory controller 1100 may include a CPU 1110, a buffer 1120, an error correction circuit (ECC) 1130, a host interface 1140, a ROM 1150, and a memory interface 1160.

The CPU 1110 may control overall operations of the memory controller 1100. The buffer 1120 may be used as a working memory of the CPU 1110. For example, when a write request is made by the host, data from the host may be temporarily stored in the buffer 1120. When a read request is made by the host, also, data read from the nonvolatile memory device 1200 may be temporarily stored in the buffer 1120.

The error correction circuit 1130 may generate an error correction code by encoding the data stored in the buffer 1120 at the write request. In this case, the encoded data and the error correction code may be stored in the nonvolatile memory device 1200. Meanwhile, the error correction circuit 1130 may decode data, which are read from the nonvolatile memory device 1200 at the read request, by using an error correction code. Here, the error correction code may be included in the read data. The ROM 1150 may store data needed to drive the memory controller 1100.

The host interface 1140 may use a protocol for performing data exchange between the host and the memory controller 1100. For example, the memory controller 1100 may be configured to communicate with the outside (or the host) through one of a variety of interface protocols such as universal serial bus (USB), multimedia card (MMC), peripheral component interconnection (PCI), PCI-express (PCI-E), advanced technology attachment (ATA), serial ATA (SATA), parallel ATA (PATA), small computer small interface (SCSI), enhanced small disk interface (ESDI), integrated drive electronics (IDE) protocols, etc. The memory interface 1160 may provide an interface between the memory controller 1100 and the nonvolatile memory device 1200.

The nonvolatile memory device 1200 may include a power noise detection unit 1210, which is implemented according to an example embodiment of the inventive concepts. For example, the power noise detection unit 1210 may detect power noises generated in the nonvolatile memory device 1200. For example, the power noises may be generated due to internal or external factors. The power noises may include noises that are associated with the power supply voltage VDD, the ground voltage GND, and the external voltage eVPP.

If a power noise is generated, the nonvolatile memory device may erroneously operate. However, the operation error due to the power noise may be transient. Accordingly, the operation error due to the power noise may differ from an operation error due to a physical defect of the nonvolatile memory device 1200. A memory page or memory block in which an operation error due to the physical defect is generated may be set to an unusable state permanently. However, in the case where an operation error due to the power noise is generated, the nonvolatile memory device 1200 may solve the operation error due to the power noise by changing an operation condition or performing an operation again. With the above description, the memory controller 1100 may need to separately process an operation error due to a physical defect and an operation error due to a power noise.

The power noise detection unit 1210 may detect a power noise by using two reference voltages and may classify the power noise as a strong power noise or a weak power noise based on the detection result. In an example embodiment, the nonvolatile memory device 1200 may send detection information about the strong power noise and the weak power noise to the memory controller 1100. The memory controller 1100 may determine whether or not of bad block setting, based on the power noise detection information. Basically, the memory controller 1100 may determine a memory block, in which an error is generated, as a hard bad block. A memory block set to the hard bad block is removed from a mapping table to be processed as a disused block. However, the memory controller 1100 may determine a memory block, in which an error due to a power noise is generated, as a soft bad block. A memory block set to the soft bad block may be reused after error correction.

Figure 11:
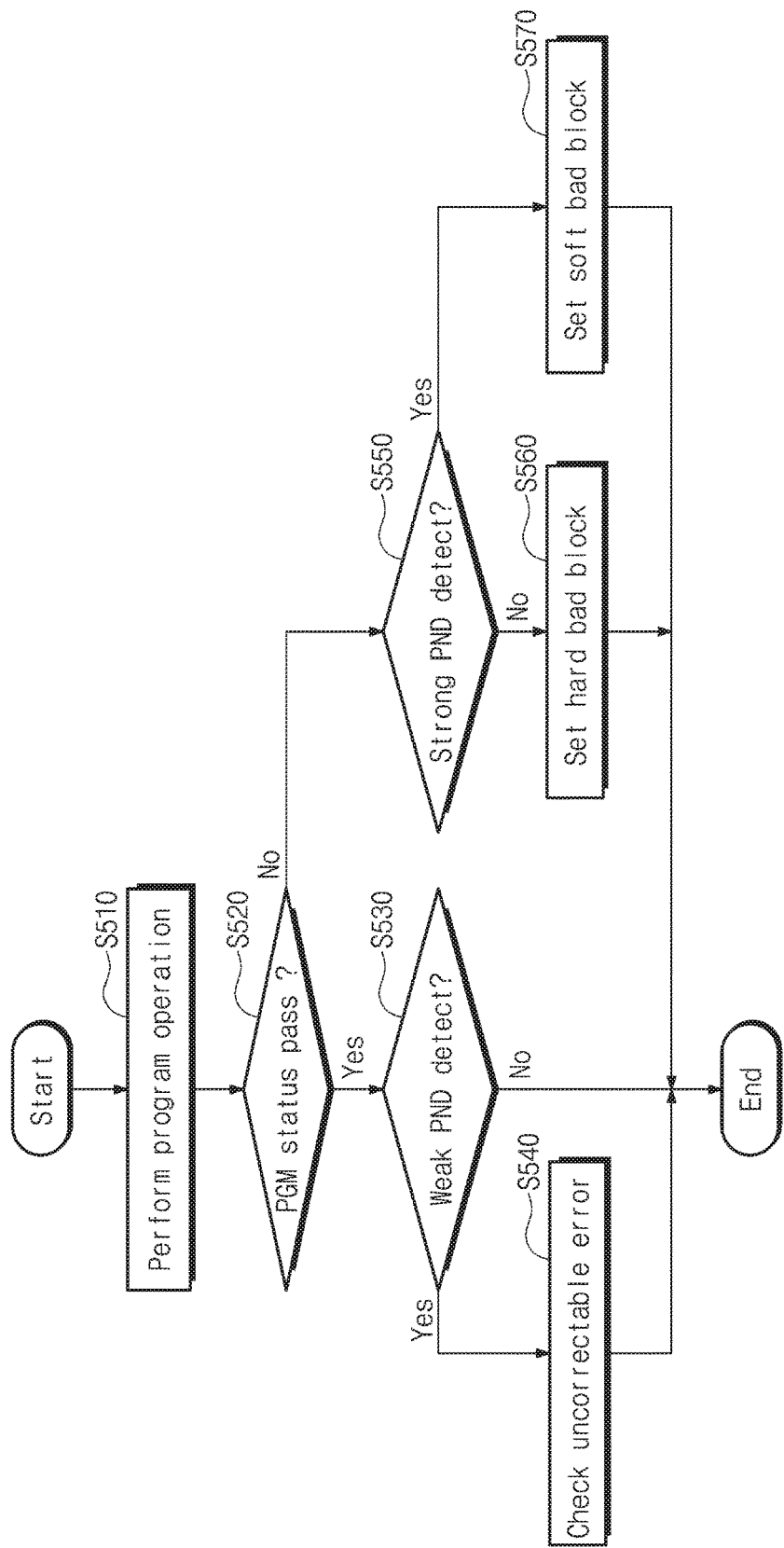
FIG. 11 is a flowchart illustrating a bad block processing method of a memory system in a program operation, according to an example embodiment of the inventive concepts.

FIG. 11 is a flowchart illustrating a bad block processing method of a memory system in a program operation, according to an example embodiment of the inventive concepts. Referring to FIG. 11, the memory controller 1100 may differently process a memory block, in which an error is generated in a program operation, based on whether a power noise of the nonvolatile memory device 1200 is detected.

In operation S510, the memory system 1000 may perform a program operation. For example, the memory controller 1100 may send a program command, an address, and data to the nonvolatile memory device 1200. The nonvolatile memory device 1200 may program the received data in a page corresponding to the received address in response to the received program command. The nonvolatile memory device 1200 may detect the strong power noise and the weak power noise through the power noise detection unit 1210 while performing the program operation. The power noise detection result may be sent to the memory controller 1100.

In operation S520, the memory controller 1100 may check a program status. If the program status indicates program pass, the process proceeds to operation S530. If the program status indicates program fail, the process proceeds to operation S550.

In operation S530, if the program status indicates the program pass, the memory controller 1100 may determine whether the weak power noise is detected in the program operation. For example, the memory controller 1100 may receive the power noise detection result from the nonvolatile memory device 1200. In the case where the weak power noise is not detected in the program operation, the memory controller 1100 may complete the program operation and may send a complete response to the host. If the program status indicates that the weak power noise is detected in the program operation, the process proceeds to operation S540. In operation S540, the memory controller 1100 may check whether an uncorrectable error is generated in the programmed data. As an error is generated due to the weak power noise in the program operation, it is necessary that the memory controller 1100 checks the uncorrectable error.

In operation S550, if the program status indicates the program fail, the memory controller 1100 may determine whether the strong power noise is detected in the program operation. If the strong power noise is not detected, in operation S560, the memory controller 1100 may set the programmed memory block to the hard bad block. The reason is that if the program status indicates the program fail in a memory block even though a power noise is not detected, the probability that the memory block has a physical defect is high. If the strong power noise is detected, in operation S570, the memory controller 1100 may set the programmed memory block to the soft bad block. The reason is that if a power noise is detected and the program status indicates the program fail, the probability that the program fail is generated due to the power noise is high. Alternatively, the memory block set to the soft bad block may be reused after being erased or correcting an error.

Figure 12:
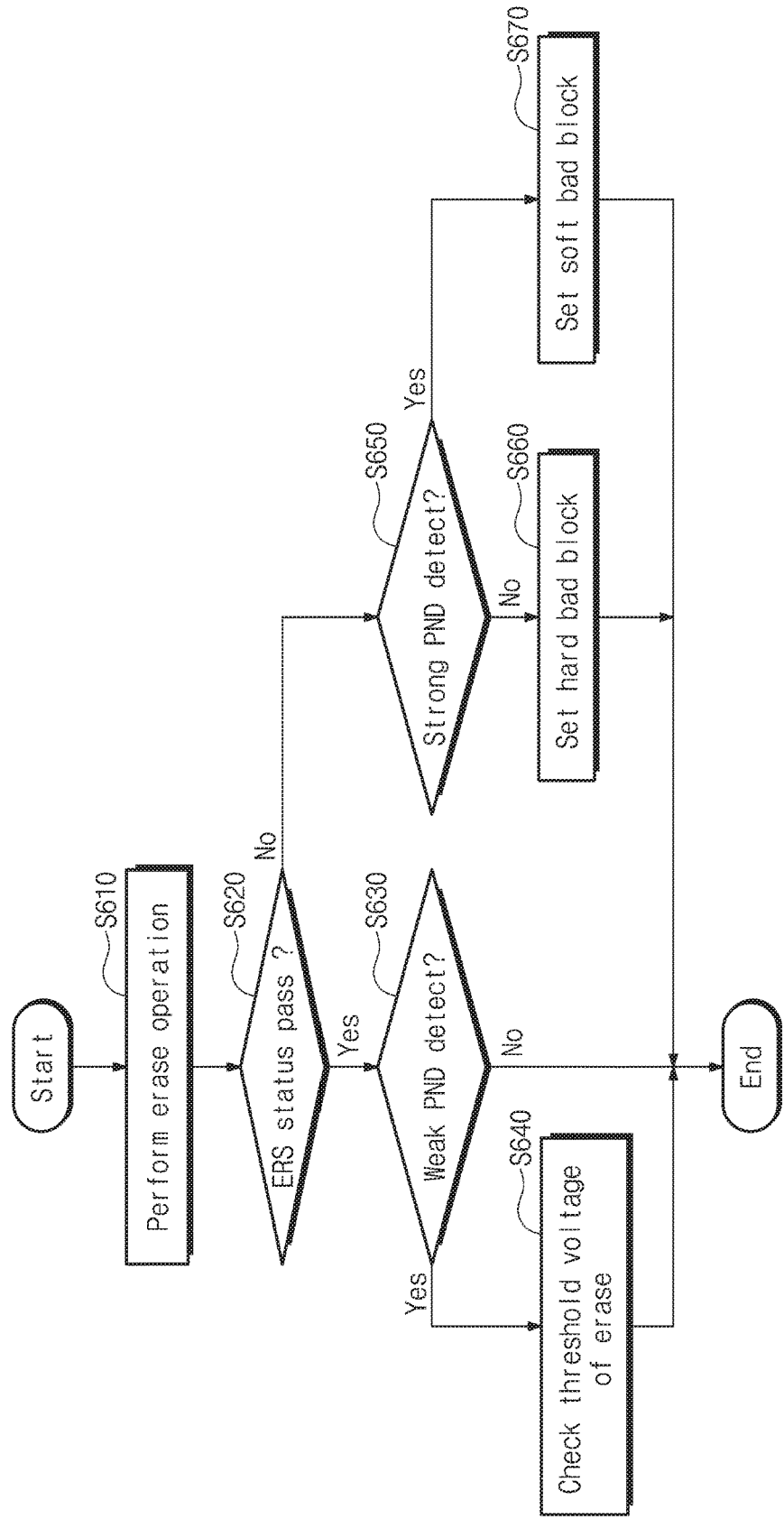
FIG. 12 is a flowchart illustrating a bad block processing method of a memory system in an erase operation, according to an example embodiment of the inventive concepts.

FIG. 12 is a flowchart illustrating a bad block processing method of a memory system in an erase operation, according to an example embodiment of the inventive concepts. Referring to FIG. 12, the memory controller 1100 may differently process a memory block, in which an error is generated in an erase operation, based on whether a power noise of the nonvolatile memory device 1200 is detected.

In operation S610, the memory system 1000 may perform the erase operation. For example, the memory controller 1100 may send an erase command and an address to the nonvolatile memory device 1200. The nonvolatile memory device 1200 may erase a memory block corresponding to the received address in response to the received erase command. The nonvolatile memory device 1200 may detect the strong power noise and the weak power noise through the power noise detection unit 1210 while performing the erase operation. The power noise detection result may be sent to the memory controller 1100.

In operation S620, the memory controller 1100 may check an erase status. If the erase status indicates erase pass, the process proceeds to operation S630. If the erase status indicates erase fail, the process proceeds to operation S650.

In operation S630, if the erase status indicates the erase pass, the memory controller 1100 may determine whether the weak power noise is detected in the erase operation. For example, the memory controller 1100 may receive the power noise detection result from the nonvolatile memory device 1200. In the case where the weak power noise is not detected in the erase operation, the memory controller 1100 may complete the erase operation and may send a complete response to the host. If the weak power noise is detected in the erase operation, the process proceeds to operation S640. In operation S640, the memory controller 1100 may check a threshold voltage of the erased memory block. The reason is that threshold voltage of the erased memory block is higher than a target voltage due to the weak power noise in the erase operation.

In operation S650, if the erase status indicates the erase fail, the memory controller 1100 may determine whether the strong power noise is detected in the erase operation. If the strong power noise is not detected, in operation S660, the memory controller 1100 may set the erased memory block to the hard bad block. The reason is that if the erase status indicates the erase fail in a memory block even though a power noise is not detected, the probability that the memory block has a physical defect is high. If the strong power noise is detected, in operation S670, the memory controller 1100 may set the erased memory block to the soft bad block. The reason is that if a power noise is detected and the erase status indicates the erase fail, the probability that the erase fail is generated due to the power noise is high. Alternatively, the memory block set to the soft bad block may be reused after being erased or correcting an error.

Figure 13:
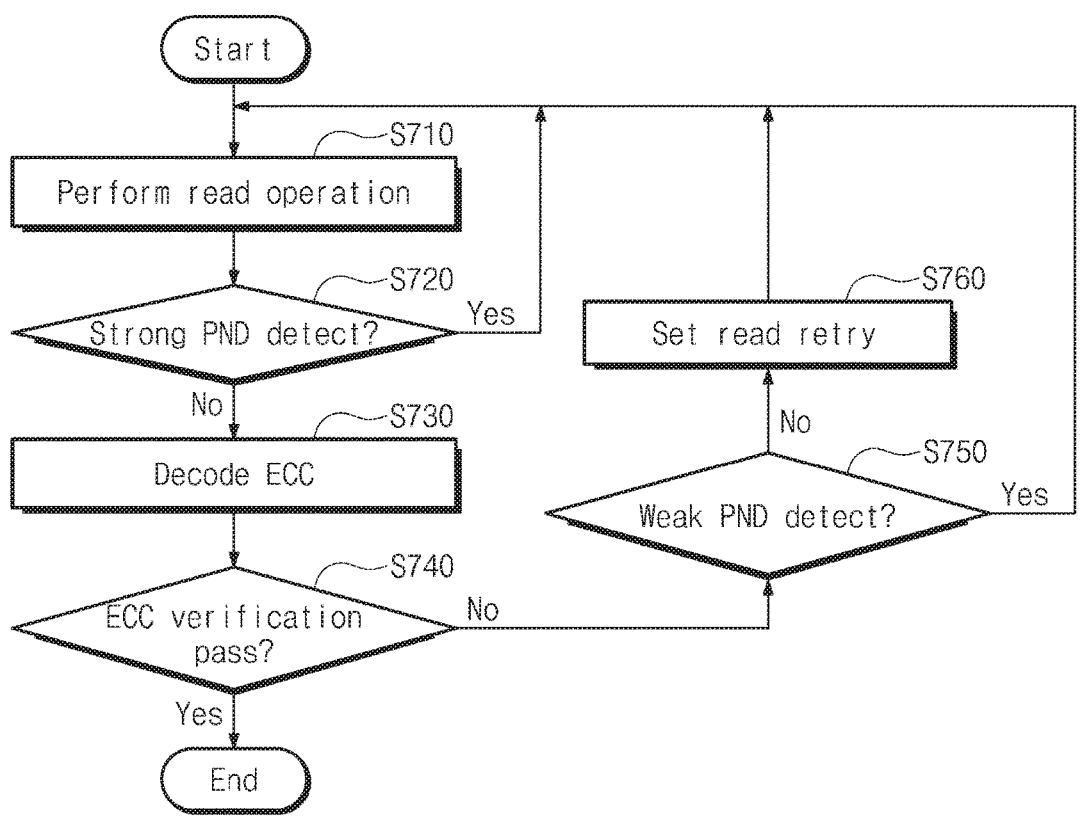
FIG. 13 is a flowchart illustrating a bad block processing method of a memory system in a read operation, according to an example embodiment of the inventive concepts.

FIG. 13 is a flowchart illustrating a power noise processing method of a memory system in a read operation, according to an example embodiment of the inventive concepts. Referring to FIG. 13, the memory controller 1100 may again perform a read operation without generation of an error correction code, based on whether a power noise of the nonvolatile memory device 1200 is detected.

In operation S710, the memory system 1000 may perform the read operation. For example, the memory controller 1100 may send a read command and an address to the nonvolatile memory device 1200. The nonvolatile memory device 1200 may read data from a page corresponding to the received address in response to the received read command. The nonvolatile memory device 1200 may detect the strong power noise and the weak power noise through the power noise detection unit 1210 while performing the read operation. The power noise detection result may be sent to the memory controller 1100.

In operation S720, the memory controller 1100 may determine whether the strong power noise is detected in the read operation. If it is determined that the strong power noise is detected, the memory controller 1100 may perform the read operation again. If the strong power noise is not detected, in operation S730, the memory controller 1100 may decode an error correction code of the read data.

In operation S740, the memory controller 1100 may verify the read data using the error correction code. If it is determined that the result of verifying the read data indicates "pass", the memory controller 1100 may complete the read operation and may send a complete response to the host. If it is determined that the result of verifying the read data indicates "fail", the process proceeds to operation S750.

In operation S750, the memory controller 1100 may determine whether the weak power noise is detected in the read operation. If it is determined that the weak power noise is detected, the memory controller 1100 may perform the read operation again. That verification failure of the read data occurs even though the weak power noise is not detected may be due to a factor that is different from the power noise. Accordingly, in operation S760, the memory controller 1100 may set read retry. Afterwards, the process proceeds to operation S710.

Figure 14:
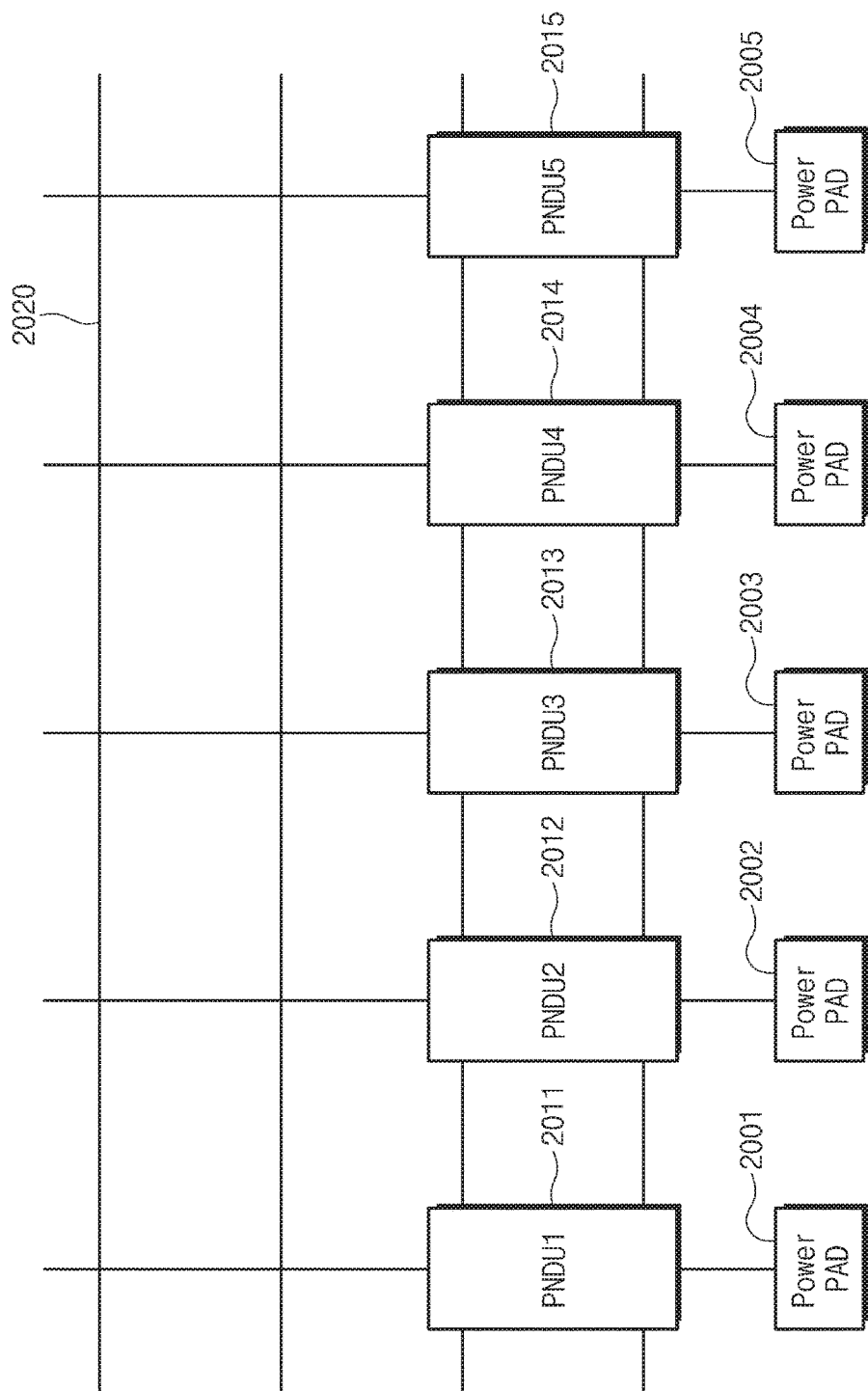
Figure 15:
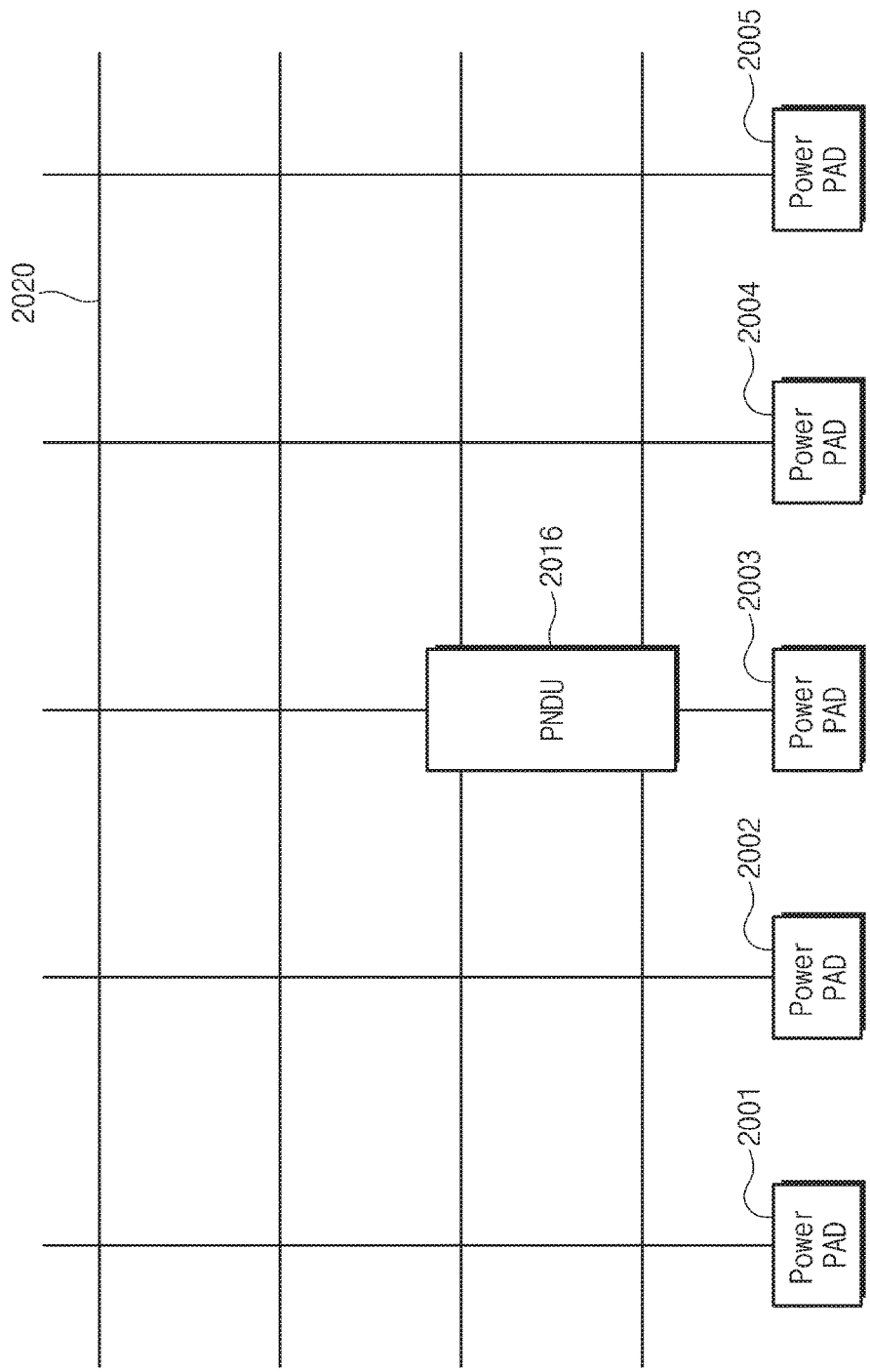

FIGS. 14 to 16 are drawings illustrating method of arranging power noise detection units, according to an example embodiment of the inventive concepts. Referring to FIG. 14, a plurality of power noise detection units 2011 to 2015 may be respectively connected to a plurality of power pads 2001 to 2005. With this arrangement, it may be possible to detect a power noise that is generated in each of the power pads 2001 to 2005. Referring to FIG. 15, the power pads 2001 to 2005 may be connected through a power wiring 2020. One power noise detection unit 2016 may detect power noises generated in the power pads 2001 to 2005. Referring to FIG. 16, the power pads 2001, 2002, 2004, and 2005 may be connected through a first power wiring 2021. A power noise detection unit 2017 may be independently connected with the power pad 2003 through a second power wiring 2022. Accordingly, the first power noise detection unit 2017 may exactly detect a power noise introduced from the outside. However, the connection between a power noise detection unit(s) and a power pad(s) is not limited thereto. In FIGS. 14 to 16, the same power is applied to the power pads 2001 to 2005.

According to an example embodiment of the inventive concepts, it may be possible to provide a nonvolatile memory device that detects power noise to efficiently manage memory blocks, in which errors are generated, and an operating method thereof.

While the inventive concepts has been described with reference to example embodiments, it will be apparent to those skilled in the art that various changes and modifications may be made without departing from the spirit and scope of the inventive concepts. Therefore, it should be understood that the above example embodiments are not limiting, but illustrative.

What is claimed is:

1. A nonvolatile memory device comprising:
a memory cell array configured to store data; and
control logic configured to,
   control a read operation, a program operation, or an erase operation on the data,
   detect a first power noise based on one voltage source of voltage sources provided to the memory cell array and a first reference voltage,
   detect a second power noise based on the one voltage source of the voltage sources, the first reference voltage, and a second reference voltage, and
   determine whether to perform at least one of an operation period of the read operation, an operation period of the program operation, or an operation period of the erase operation, based on whether at least one of the first and second power noises are detected,
wherein the control logic comprises,
   a power noise detector configured to detect the first and second power noises based on the one voltage source of the voltage sources and the first and second reference voltages,
   a timer configured to measure a duration of the second power noise, and
   a register configured to store detection information of the first and second power noises.

2. The nonvolatile memory device of claim 1, wherein in response to a level of one voltage source of the voltage sources increasing, the control logic detects the first power noise in response to the level of the one voltage source being larger than the first reference voltage, and the control logic detects the second power noise in response to the level of the one voltage source being between the first reference voltage and the second reference voltage.

3. The nonvolatile memory device of claim 1, wherein in response to a level of one voltage source of the voltage sources decreasing, the control logic detects the first power noise in response to the level of the one voltage source being smaller than the first reference voltage and the control logic detects the second power noise in response to the level of the one voltage source being between the first reference voltage and the second reference voltage.

4. The nonvolatile memory device of claim 1, wherein the control logic is configured to perform a recovery period of the read operation in response to the first power noise being detected during the read operation.

5. The nonvolatile memory device of claim 4, wherein the control logic is configured to perform a bit line initialization period again in response to the second power noise being detected in the bit line initialization period of the read operation.

6. The nonvolatile memory device of claim 4, wherein the control logic is configured to perform a bit line precharge period again after adjusting a time setting of the bit line precharge period in response to the second power noise being detected in the bit line precharge period of the read operation.

7. The nonvolatile memory device of claim 4, wherein the control logic is configured to perform a sensing period again in response to the second power noise being detected in the sensing period of the read operation.

8. The nonvolatile memory device of claim 1, wherein the control logic is configured to perform a recovery period of the program operation in response to the first power noise being detected during the program operation.

9. The nonvolatile memory device of claim 8, wherein the control logic is configured to in response to the second power noise being detected in a program execution period of the program operation perform the program execution period again after adjusting a step pulse voltage setting of the program operation and a time setting of the program execution period.

10. The nonvolatile memory device of claim 1, wherein the control logic is configured to perform a recovery period of the erase operation in response to the first power noise being detected during the erase operation.

11. The nonvolatile memory device of claim 10, wherein the control logic is configured to perform an erase execution period again after adjusting a step pulse voltage setting of an erase operation and a time setting of the erase execution period in response to the second power noise being detected in the erase execution period of the erase operation.

12. A memory system comprising:
a memory device configured to,
   detect a first power noise based on a voltage source and a first reference voltage, and
   detect a second power noise based on the voltage source and a second reference voltage; and
a memory controller configured to,
   perform a first stage of an operation, and
   perform the first stage of the operation again in response to the memory device detecting the second power noise while the memory controller performs the first stage of the operation;
the memory device being further configured to perform a recovery stage of the operation, in response to the memory device detecting the first power noise while the memory controller performs the first stage of the operation.

13. The memory system of claim 12, wherein
the memory controller is further configured to,
   perform a second stage of the operation, in response to neither the first power noise nor the second power noise being detected by the memory controller while the memory device performs the first stage of the operation, and
   perform the second stage of the operation again, in response to the second power noise being detected while the memory controller performs the second stage of the operation, and
the memory device is further configured to,
perform the recovery stage of the operation after performing the second stage of the operation, in response to the memory device not detecting the second power noise while the memory controller performs the second stage of the operation.

14. The memory system of claim 13 wherein the memory device is further configured to,
   set a block corresponding to the operation to a power noise detection status, in response to the memory device detecting either the first power noise or the second power noise while the memory controller performs the first and second stages of the operation.

15. The memory system of claim 12, wherein the operation is one of a read operation, a program operation, or an erase operation.

16. The memory system of claim 12 wherein
the memory controller is further configured to,
- perform each of a plurality of stages of the operation, after performing an immediately preceding stage of the operation among the plurality of stages of the operation, in response to neither the first power noise nor the second power noise being detected by the memory controller while the memory device performs the immediately preceding stage of the operation, the first stage of the operation being the first of the plurality of stages of the operation, and
- perform any one of the plurality of the stages of the operation again, in response to the memory device detecting the second power noise while the memory controller performs the one of the plurality of the stages of the operation, and The memory device is further configured to,
- perform the recovery stage of the operation after the memory controller performs the one of the plurality of stages of the operation, in response to the memory device detects the first power noise while the memory controller performs the one of the plurality of stages of the operation,
- perform the recovery stage of the operation after performing each of the plurality of stages of the operation, in response to the memory device not detecting the second power noise while the memory controller performs a last stage of the plurality of stages of the operation, and
- set a block corresponding to the operation to a power noise detection status, in response to the memory device detecting either the first power noise or the second power noise while the memory controller performs the plurality of stages of the operation.

17. A nonvolatile memory device comprising:
a memory cell array configured to store data; and
control logic configured to,
- control a read operation, a program operation, or an erase operation on the data,
- detect a first power noise based on one of voltage sources provided to the memory cell array and a first reference voltage,
- detect a second power noise based on the one voltage source of the voltage sources, the first reference voltage, and a second reference voltage, and
- determine whether to perform at least one of an operation period of the read operation, an operation period of the program operation, or an operation period of the erase operation, based on whether at least one of the first and second power noises are detected, wherein either,
(1) in response to a level of one voltage source of the voltage sources increasing, the control logic detects the first power noise in response to the level of the one voltage source being larger than the first reference voltage, and the control logic detects the second power noise in response to the level of the one voltage source being between the first reference voltage and the second reference voltage, or
(2) in response to the level of one voltage source of the voltage sources decreasing, the control logic detects the first power noise in response to the level of the one voltage source being smaller than the first reference voltage and the control logic detects the second power noise in response to the level of the one voltage source being between the first reference voltage and the second reference voltage.

* * * * *